(12) United States Patent
Lamblin

(10) Patent No.: US 8,981,970 B2
(45) Date of Patent: Mar. 17, 2015

(54) HIERARCHICAL CODING

(71) Applicant: Orange, Paris (FR)

(72) Inventor: Claude Lamblin, Tregastel (FR)

(73) Assignee: Orange, Paris (FR)

( * ) Notice: Subject to any disclaimer, the term of this patent is extended or adjusted under 35 U.S.C. 154(b) by 0 days.

(21) Appl. No.: 14/352,750

(22) PCT Filed: Oct. 19, 2012

(86) PCT No.: PCT/FR2012/052400
§ 371 (c)(1),
(2) Date: Apr. 18, 2014

(87) PCT Pub. No.: WO2013/057453
PCT Pub. Date: Apr. 25, 2013

(65) Prior Publication Data
US 2014/0247166 A1 Sep. 4, 2014

(30) Foreign Application Priority Data
Oct. 19, 2011 (FR) ...................................... 11 59425

(51) Int. Cl.
*H03M 7/00* (2006.01)
*H03M 7/30* (2006.01)
(Continued)

(52) U.S. Cl.
CPC ........... *H03M 7/3084* (2013.01); *G10L 19/002* (2013.01); *G10L 19/24* (2013.01)
USPC .............. 341/51; 375/295; 375/316; 375/320; 375/340; 382/240; 382/233; 382/299; 341/55; 341/60; 341/65

(58) Field of Classification Search
CPC ... H03M 7/3084; G10L 19/002; G10L 19/24; H04N 19/00139; H04N 19/00424; H04N 19/00533; H04N 19/00781
USPC .............. 341/50–70; 375/295, 316, 320, 340; 382/240, 233, 299
See application file for complete search history.

(56) References Cited

U.S. PATENT DOCUMENTS 5,548,708 A * 8/1996 Sakashita et al. ............. 345/501
5,608,862 A * 3/1997 Enokida ........................ 345/501
(Continued)

FOREIGN PATENT DOCUMENTS

EP 2 187 387 A2 5/2010

*Primary Examiner* — Lam T Mai
(74) *Attorney, Agent, or Firm* — Drinker Biddle & Reath LLP

(57) ABSTRACT

A binary allocation in a hierarchical coding/decoding comprising a coding/decoding of a digital signal enhancement layer. The signal comprises a succession of L samples, each sample being represented by a mantissa and an exponent. The method comprises the allocation of a predetermined number $N_b$ of enhancement bits to a part at least of the L samples of highest exponent values. In particular, the method comprises the steps: a) enumerating the exponents of the L samples each having a given value, b) calculating at least one aggregate of enumerations of exponents by decreasing values of exponent until the predetermined number $N_b$ is approximated from above, for c) determining a threshold value of largest exponent iexp0 of sample for which no more enhancement bit is available, and allocating the $N_b$ enhancement bits, according to chosen rules, to the samples whose exponent is greater than the aforesaid threshold value $iexp_o$.

14 Claims, 10 Drawing Sheets

(51) Int. Cl.
*G10L 19/002* (2013.01)
*G10L 19/24* (2013.01)

(56) References Cited

U.S. PATENT DOCUMENTS

| | | | |
|---|---|---|---|
| 5,784,526 A * | 7/1998 | Shimoda et al. | 386/316 |
| 5,977,996 A * | 11/1999 | Kondo | 345/536 |
| 6,144,968 A * | 11/2000 | Zellweger | 1/1 |
| 6,442,297 B1 * | 8/2002 | Kondo et al. | 382/240 |
| 6,546,142 B2 * | 4/2003 | Katata et al. | 382/239 |
| 7,725,799 B2 * | 5/2010 | Walker et al. | 714/755 |
| 7,813,453 B2 * | 10/2010 | Khandekar et al. | 375/340 |
| 7,848,429 B2 * | 12/2010 | Marquant et al. | 375/240.19 |
| 7,933,460 B2 * | 4/2011 | Owada | 382/240 |
| 8,102,923 B2 * | 1/2012 | Gorokhov et al. | 375/242 |
| 8,306,119 B2 * | 11/2012 | Marquant et al. | 375/240.16 |

* cited by examiner

HIERARCHICAL CODING

CROSS-REFERENCE TO RELATED APPLICATIONS

This application is the U.S. national phase of the International Patent Application No. PCT/FR2012/052400 filed Oct. 19, 2012, which claims the benefit of French Application No. 11 59425 filed Oct. 19, 2011, the entire content of which is incorporated herein by reference.

FIELD

The present invention relates to the coding/decoding of digital signals, in particular in applications for the transmission or storage of digital signals such as audio (voice and/or sounds) or video or, more generally, multimedia.

BACKGROUND

It relates in particular to digital coding/decoding, of the logarithmic type implemented for example by the ITU-T G.711.1 coder.

The compression of signals in order to reduce the bit rate while maintaining a good quality of perception can make use of numerous techniques, including:
- the PCM (Pulse Code Modulation) technique and variants thereof such as ADPCM (Adaptive Differential PCM),
- the CELP (Code Excited Linear Prediction) techniques and
- the techniques known as "by transformation" (for example of the MDCT (Modified Discrete Cosine Transformation) type).

The PCM technique compresses the signal, sample by sample, with a given number of bits while the other types of techniques compress blocks of samples (or frames).

Coding/decoding according to ITU-T Recommendation G.711 is one of the most widely used for voice signals, both in traditional telephony (over the switched network) and over the Internet (voice over IP or VoIP). Such coding uses the technique known as "logarithmic PCM".

The coding/decoding principle according to ITU-T Recommendation G.711 is summarized below.

The G.711 coder is based on 8-bit logarithmic compression at the sampling frequency of 8 kHz to give a bit rate of 64 kbit/s.

The principle of G.711 PCM coding is to perform compression of filtered signals in the 300-3400 Hz band by a logarithmic curve which makes it possible to obtain an almost constant signal-to-noise ratio for a broad dynamic range of signals. This involves coding by quantization with the quantization step varying with the amplitude of the sample to be coded:
- when the incoming signal level is weak, the quantization step is small,
- when the incoming signal level is strong, the quantization step is large.

Two logarithmic PCM compression laws are used:
- µ law (used in North America and Japan) and
- A law (used in Europe and the rest of the world).

G.711 coding according to the A law and G.711 coding according to the µ law use 8-bit encoding of incoming samples.

In practice, in order to facilitate the implementation of the G.711 coder, the logarithmic PCM compression has been approximated by a segmented curve.

In the A law, the 8 bits are distributed as follows:
- 1 sign bit,
- 3 bits to indicate the segment,
- 4 bits to indicate the position on the segment.

The PCM coding/decoding principle is summarized with reference to FIG. 1. The PCM coder 11 comprises a quantization module $Q_{MIC}$ 10 which receives the incoming signal S(z) at the input. The quantization index $I_{MIC}$ at the output of the quantization module 10 is transmitted over the transmission channel 12 to the decoder 14. The PCM decoder 14 receives the indices $I'_{MIC}$ sent from the transmission channel at the input (version possibly degraded by bit errors in $I_{MIC}$) and performs inverse quantization by means of the inverse quantization module 13 ($Q^{-1}_{MIC}$) to obtain the decoded signal. Standardized ITU-T G.711 PCM coding (hereinafter called G.711) performs a compression of the amplitude of signals by means of a logarithmic curve prior to uniform scalar quantization, which makes it possible to obtain an almost constant signal-to-noise ratio for a broad dynamic range of signals. The quantization step in the original signal domain is therefore proportional to the amplitude of the signals. Successive samples of the compressed signal are quantized to 8 bits, i.e. 256 levels.

A quantization index $I_{PCM}$ (reference 15 in the example shown in FIG. 1) can therefore be considered to be the representation of a floating point number with 4 mantissa bits "Pos", 3 exponent bits "Seg" and a sign bit "S".

In the binary representation (sign and absolute value) of the sample to be coded over 16 bits, notating the least significant bit (LSB) of a sample $b_0$, the exponent indicates the position pos of the first "1" among positions 14 to 8, the mantissa bits then being the next 4 bits and the sign bit being bit $b_{15}$.

Thus, if position pos=14, exp=7; if pos=13, exp=6, ..., if pos=8, exp=1.

If the first "1" is after position 8 (which corresponds to an absolute value of the sample to be coded less than or equal to 255), the exponent is 0.

In an example given in the table below where the first bit set at "1" is bit $b_{10}$ (pos=10), the exponent exp is 3, and the 4 bits of the mantissa are the 4 bits in positions 9 to 6: $m_3 m_2 m_1 m_0$ (=$b_9 b_8 b_7 b_6$).

| $b_{15}$ | $b_{14}$ | $b_{13}$ | $b_{12}$ | $b_{11}$ | $b_{10}$ | $b_9$ | $b_8$ | $b_7$ | $b_6$ | $b_5$ | $b_4$ | $b_3$ | $b_2$ | $b_1$ | $b_0$ |
|---|---|---|---|---|---|---|---|---|---|---|---|---|---|---|---|
| S | 0 | 0 | 0 | 0 | 1 | $m_3$ | $m_2$ | $m_1$ | $m_0$ | | | | | | |

G.711 type encoding of a digital signal can be performed by comparison with the quantizer decision thresholds, a search by dichotomy making it possible to speed up the calculations. This search by comparison with thresholds requires the storage of decision thresholds and quantization indices corresponding to the thresholds. Another encoding solution, less costly in calculations, consists of eliminating the 4 least significant bits by right-shifting 4 bits, then adding 2048 to the shift value. The quantization index is finally obtained by simple reading of a table with 4096 entries, which, however, requires a larger read-only memory (ROM) than in the method presented above.

In order to avoid storing such tables, the quantization index can be determined with simple operations of low complexity. Such is the case in the G.711.1 encoder. A right shift of at least 4 bits is still applied. For samples to be coded over 16 bits, the smallest quantization step remains 16. The 4 least significant bits are still lost.

More generally, only the 4 bits following the first bit set at "1" are transmitted: the other bits are lost. Thus:

in the first segment ($|x| \leq 255$, exp=0), the 4 least significant bits are lost (mant=x>>4); and in the other segments ($2^{exp+7} \leq |x| < 2^{exp+8}$, 0<exp<8), the (3+exp) least significant bits are lost (mant=x>>(3+exp)).

The number of bits lost thus increases with the segment number up to 10 bits for the last segment (exp=7).

At the decoder, the decoded signal is obtained at the output of the inverse PCM quantizer (FIG. 1). If inverse quantization is implemented by a table, it consists simply of pointing by the index in the table of 256 decoded values. Decoding can thus be performed by simple operations of the same type.

The version according to the μ law is quite similar. The main difference is the addition of 128 to the values to ensure that, in the first segment, bit 7 is always equal to 1. Such an arrangement makes it possible to:

make the transmission of bit 7 unnecessary, nevertheless increase the coding precision in the first segment (the quantization step being equal to 8 in the first segment as against 16 in the coding according to the A law), process all the segments in an identical manner.

Furthermore, there is addition of 4 (thus 128+4=132 in total) for rounding, thus producing the level "0" among the quantized values (since the A law has no level 0, the smallest values being ±8). The price of this better resolution in the first segment is the shifting of all the segments by 132. As for the A law, decoding is performed either by reading a table or by a set of algorithmically simple operations.

The signal-to-noise ratio (SNR) obtained by PCM coding is almost constant (~38 dB) for a broad dynamic range of signals. The quantization step in the original signal domain is proportional to the amplitude of the signals. This signal-to-noise ratio is not sufficient to render the quantization noise inaudible. Furthermore, for weak signal levels (first segment), the SNR is very poor and may even be negative.

The quality of the G.711 coder is deemed to be good for narrow-band voice signals (sampling frequency 8 kHz). However, this quality is not excellent and the difference between the original signal to be coded and the decoded signal is perceptible with audible coding noise. In some applications, it is necessary to be able to increase the quality of the PCM coding in the 0-4000 Hz band by adding an optional layer, for example 16 kbit/s (thus 2 bits per sample). When the decoder receives this enhancement layer, it can enhance the quality of the decoded signal.

A G.711 coding/decoding principle known as "hierarchical" is presented below.

In the case of G.711 coding, a coder which is not very complex and not very costly in terms of memory, it is worthwhile considering a technique of hierarchical extension also with low complexity and reasonable memory requirements. Such a technique (as described for example in document US-2010/191538) consists of recovering the bits not transmitted in the mantissa of the PCM coding and transmitting them in the enhancement layer. In the event of reception of this layer, the decoder can decode the mantissa with greater precision. This technique, which makes it possible to obtain an increase in the SNR of 6 dB for each bit added per sample, consists of saving and transmitting in an enhancement bitstream the most significant bits among the bits lost during the initial PCM coding. For example, in the case of an enhancement layer at 16 kbit/s (2 bits per sample), the bits to be sent in this layer can be obtained by performing the right shift in two steps to save the 2 bits following the 4 bits of the mantissa.

The encoder sends in the extension layer the bits corresponding to the first (significant) bits of the bits which would otherwise be lost owing to the limited precision of logarithmic PCM coding. These extension bits make it possible to add supplementary positions to the segments "Seg", thus enhancing the information on the samples of the greatest amplitudes. The decoder concatenates the extension bits received behind the base layer bits to obtain greater precision in the positioning of the decoded sample in the segment. At the decoder, the rounded value is adapted depending on the number of extension bits received.

This technique of recovering bits not transmitted in the mantissa of the PCM coding to transmit them in an enhancement layer is used to enhance the coding of the low band in the ITU-T G.711.1 coder.

The ITU-T G.711.1 coder, version 2008, is an extension of the PCM G.711 coding. This involves a hierarchical 64 to 96 kbit/s coder which is fully interoperable with the G.711 coder (A law or μ law). This standard meets the requirements for enhanced quality of VoIP applications. The functional diagram for G.711.1 coding/decoding is given in FIG. 2. The G.711.1 coder operates on audio signals sampled at 16 kHz on 5 ms blocks or frames (i.e. 80 samples at 16 kHz). The incoming signal S(z) is divided into two sub-bands SB1: [0-4 kHz] and SB2: [4 kHz-8 kHz] by filters 20 of the QMF (Quadrature Mirror Filters) type. The bit rate of 64 kbit/s ("Layer 0" compatible with G.711 (L0)) corresponds to quantization of the 0-4 kHz sub-band by the PCM (module 21) technique equivalent to the G.711 coding presented above, with shaping of the quantization noise. The next two layers ("Layers 1-2") respectively code:

the 0-4 kHz low band using an enhancement technique (ENH) for the PCM coding (enhancement module 23 for "Layer 1" (L1)), and the 4-8 kHz high-pass band by MDCT transform coding (module 22 for "Layer 2" (L2)), each with a bit rate of 16 kbit/s (80 bits per frame).

The enhancement layer ("Layer 1") of the low band makes it possible to reduce the quantization error of the core layer ("Layer 0") by adding supplementary bits to each sample coded according to Recommendation G.711. As indicated above, it adds additional mantissa bits to each sample. The number of additional bits for the mantissa depends on the sample amplitude. Rather than allocate the same number of bits to enhance the precision of the mantissa coding of the samples, the 80 bits available in layer 1 (L1) to enhance the precision of the mantissa coding of the 40 samples are allocated dynamically, more bits being attributed to the samples with a significant exponent. Thus, while the budget for bits in the enhancement layer is 2 bits per sample on average (16 kbit/s), the enhancement signal has a resolution of 3 bits per sample and, with this adaptive allocation, the number of bits allocated to a sample varies depending on its exponent value from 0 to 3 bits.

A description is given below of how the coding/decoding of enhancement layer "1" (L1) of the low band of the G.711.1 coder operates.

Encoding with adaptive bit allocation takes place in two phases:

a first phase of generation of the bit allocation table, followed by a phase of dynamic multiplexing of the enhancement signal.

The procedure is common both A and μ laws.

The bit allocation table is generated using the exponents of the 40 samples, exp(n), with n=0 to n=39. The procedure for generating the bit allocation table itself comprises two steps:

in a first step, an exponent map and a table of exponent index counters are calculated from the exponents and in a second step, the bit allocation table is calculated.

An exponent map, map(j,n), j=0, . . . , 9, n=0, . . . , 39, and a table of exponent index counters, cnt(j), j=0, . . . , 9, are calculated according to the following operations, with reference to FIG. 3 in which step S11 consists of resetting the table of exponent index counters to zero: cnt(j)=0, j=0, . . . 9 and a loop index n on the 40 samples.

Next, for each of the 40 samples (with a loop on n=0, . . . , 39), (in a loop on i=0, . . . , 2)
step S12 corresponds to a calculation of three exponent indices: iexpn=exp(n)+i, i=0, 1, 2;
step S13 corresponds to an update of the exponent map: map(iexpn,cnt(iexpn))=n
step S14 corresponds to an incrementation of the table of exponent index counters: cnt(iexpn)=cnt(iexpn)+1

At the end of this procedure, the table of exponent index counters cnt(j) indicates the number of samples with the same exponent index and the exponent map contains the indices of the samples using a given exponent index.

Thus, cnt(6) is the number of samples which could have 6 as the exponent index, i.e. the number of samples with exponents equal to 6 (i=0), 5 (i=1), or 4 (i=2), map(6,j), j=0, cnt(6)−1, then containing the indices of these cnt(6) samples.

The bit allocation table, b(n), n=0, . . . , 39, is then calculated as follows, with reference to FIG. 4, on which step S21 consists of resetting:
the bit allocation table, b(n) to zero: b(n)=0, n=0, . . . , 39,
the number of bits to be allocated $N_b$ to 80: $N_b$=80
the exponent index, iexp, to its maximum value (here, 9=7+2): iexp=9

After this first resetting step, subsequent steps S22 to S25 are iterated until all the bits are allocated:
S22: Comparison of the number of bits to be allocated $N_b$ with the exponent index counter, cnt(iexp), to determine the smaller of the two: min(cnt(iexp), $N_b$)
S23: Incrementation by 1 of the bit allocation of the min (cnt(iexp), $N_b$) first samples with indices corresponding to the exponent index iexp in the exponent map:

$b(n)=b(n)+1$, for all n=map(iexp j), j=0, . . . , min(cnt(iexp), $N_b$)−1,
S24: Update of the number of bits to be allocated:

$N_b=N_b-\min(cnt(\text{iexp}),N_b)$

S25: Test to verify whether all the bits have been allocated ($N_b$=0).
If $N_b$>0, decrementation by 1 of the exponent index: iexp=iexp−1 and passing to the next iteration by going to step S22.
Otherwise ($N_b$=0: all the bits have been allocated) and the calculation of the bit allocation table is finished.

These procedures are described in particular in documents EP-2187387 and EP-2202728.

The bit allocation table, b(n), n=0, . . . , 39, gives for each sample the number of most significant bits in the extension layer. The enhancement codes are thus extracted, then sequentially multiplexed in the bitstream of the enhancement layer. Here, 3 bits following the 4 bits of the mantissa are saved, rather than just 2 bits in the G711 hierarchical coder with fixed bit allocation. Then, after calculating the adaptive bit allocation table, the b-bit extension signal (b=0, 1, 2 or 3) is extracted while only retaining the b most significant bits. For this, depending on the number b of bits allocated, a right shift of 3−b bits is performed.

In comparison with multiplexing of the enhancement signal with fixed bit allocation, multiplexing with adaptive bit allocation is more complex. Whereas, in the case of fixed bit allocation with 2 enhancement bits per sample, the composition of the bitstream of this enhancement layer in bytes of 8 bits is simple, this is not the case for dynamic allocation.

With fixed allocation of 2 bits per sample, each of the 10 bytes of the enhancement layer is constituted by the 2 enhancement bits of 4 consecutive samples. Thus, the 8 bits ($b_7b_6b_5b_4b_3b_2b_1b_0$) of the first byte are:
the 2 enhancement bits of sample 0 ($b_7b_6$),
followed by the 2 enhancement bits of sample 1 ($b_5b_4$),
then by the 2 enhancement bits of sample 2 ($b_3b_2$),
and finally by the 2 enhancement bits of sample 3 ($b_1b_0$).
More generally, the 8 bits ($b_7b_6b_5b_4b_3b_2b_1b_0$) of the $i^{th}$ byte (i=0, . . . 9) are:
the 2 enhancement bits of sample 4i ($b_7b_6$),
followed by the 2 enhancement bits of sample 4i+1 ($b_5b_4$),
then by the 2 enhancement bits of sample 4i+2 ($b_3b_2$),
and finally by the 2 enhancement bits of sample 4i+3 ($b_1b_0$).

In decoding, the bit allocation table is reconstituted according to the same principle described above, the exponent values being available to the encoder and to the decoder. Then, the enhancement signal is reconstituted from the bitstream of the enhancement layer which uses the bit allocation table.

However, there are disadvantages inherent in the current coding/decoding of the low-band enhancement layer of the G.711.1 coder.

In comparison with fixed allocation (typically 2 bits per sample), dynamic bit allocation makes it possible to allocate a number of enhancement bits dependent on the amplitudes of the samples to be coded. However, this adaptive allocation is markedly more complex than a fixed allocation. It requires more random access memory and also more calculations, without taking account of the number of instructions to be stored in read only memory.

For example, in the case of a G.711.1 codec where 80 bits are allocated to 40 samples and the number of bits allocated varies from 0 to 3 bits, dynamic bit allocation, in comparison with fixed bit allocation, requires the following tables to be stored:
Bit allocation table: 40 words of 16 bits
Exponent map table: 400 (=10×40) words of 16 bits
Exponent counter table: 10 words of 16 bits Thus, in comparison with fixed allocation in the case of G.711.1, dynamic allocation requires of the order of 450 words of memory.

As regards the complexity of calculation, calculation of the exponent map and the associated exponent counters table, as well as the iterative procedure for dynamic bit allocation, require complex addressing, numerous memory accesses and tests.

The initial resetting of the exponent counter table requires for example 10 memory accesses, then, a loop is performed on 40 samples, as follows:
a) memory access to obtain iexpn the exponent of sample n
b) addressing in the exponent map to point to the address adr_map of map(iexpn,0)
c) addressing in the counter table to point to the address adr_cnt of cnt(iexpn): adr_cnt=cnt+iexpn
d) then a loop is performed on 3 indices (i=0, 1, 2)
   i. reading (memory access) the value stored in memory at address adr_cnt: *adr_cnt
   ii. addressing in the exponent map to point to the address adr_mapi of map(iexpn, *adr_cnt): adr_mapi=adr_map+*adr_cnt
   iii. writing (storage) at this address n: *adr_mapi=n
   iv. incrementing by 1 the value of the exponent counter contained at address adr_cnt: *adr_cnt=*adr_cnt+1 v. incrementing by 1 the address adr_cnt: adr_cnt++ vi. incrementing by 40 the address adr_map: adr_map=adr_map+40

Operations a), b), c) and d) are performed 40 times; the operations in the internal loop d) (operations i to vi) are performed 120 (=40×3) times.

Although the complexity of regular addressing (with a constant increment as in operations v and vi) is considered negligible, such is not the case for certain less regular addressing operations. Although the addressing in table cnt is not very costly (addition of step c)), the addressing in the exponent map table is relatively complex.

In particular, pointing to the address of an element map(j,n) in a two-dimensional table (10 and 40) requires calculation of 40j+n. If the addition of n has a significance of "1", multiplication by 40 costs "3". In order to reduce the cost of this addressing, it is possible to store partial addresses, but at the cost of an increase in the size of the random-access memory.

Calculation of the bit allocation table is also complex, in that resetting the bit allocation table to zero and the number of bits to be allocated to 80 requires 41 memory accesses. Addressing in the exponent counter tables and in the exponent map is also reset to point respectively to addresses adr_cnt of cnt(9) and adr_map of map(9,0) (adr_cnt=cnt+9, adr_map=map+40*9).

Then, a loop on 10 exponent index values (iexp decrementing from 9 to 0) executes the following operations:

e) Test to determine whether the number of bits remaining to be allocated $N_b$ is smaller than the current value of the exponent counter, *adr_cnt (=cnt(iexp));
   if so, the variable $N_b$ is stored in the variable bit_cnt;
   if not, it is the value *adr_cnt which is stored.
This storage is counted as a memory access.

f) Resetting addressing in the exponent map to point to address adr_mapi of map(iexp, 0): adr_mapi=adr_map g) then a loop on bit_cnt indices (i=0, 1, bit_cnt-1) is performed to increment by 1 bit the bit allocation of each of the bit_cnt first samples the indices of which are stored from map(iexp,0) to map(iexp, bit_cnt-1). In this internal loop, the following operations are performed:
   reading (memory access) index n of the sample stored in memory at address adr_mapi (i.e. address of the element map(iexp,i)): n=*adr_mapi
   addressing in the bit allocation table to point to address adr_b of the element b(n): adr_b=b+n
   increment by 1 (addition) of the bit allocation of sample n and storage of the incremented value (memory access): *adr_b=*adr_b+1 (b(n)=b(n)+1)
   increment by 1 of the address in the exponent map: adr_mapi++(adr_mapi now points to the address of the element map(iexp,i+1)

h) Updating the number of bits remaining to be allocated (subtraction): $N_b=N_b-$bit_cnt i) Test to determine whether all the bits have been allocated:
   If so ($N_b=0$), leave the loop on iexp: bit allocation is finished
   If not ($N_b>0$), decrement by 40 the address adr_map: adr_map=adr_map−40 to point to the address of the element map(iexp−1, 0) and perform steps e) to i) for the next exponent (iexp=iexp−1).

The number of times the external loop is performed (operations e to i) depends on the exponent map (and thus on the distribution of the exponents of samples to be coded). The variability of this number makes the loop more complex. If the number of repetitions of a loop is not known before entering the loop, it is necessary at the end of each iteration to perform a test (step i). The number of times the internal loop operations are conducted is equal to the total number of bits to be allocated (80 in the case of G.711.1). In particular, it is still the case that these operations consist of allocating 1 bit at a time.

As regards multiplexing, as mentioned above, with adaptive bit allocation, multiplexing of the bits in the enhancement layer in the bitstream is far more complex than with fixed bit allocation.

With dynamic allocation, the composition of the bitstream is not regular: the number of samples the bits of which make up a byte varies and the enhancement bits of one and the same sample can be on different bytes. In comparison with fixed multiplexing, adaptive multiplexing is far more complex and requires, in the above example, 40 loop tests ("IF" type) and 80 supplementary additions/subtractions. The final composition of the 10 bytes also requires 20 subtractions and 20 bit offsets.

Thus, although the G.711 coding technique has been enhanced in quality by the introduction of a hierarchical extension with dynamic bit allocation, this dynamic allocation requires a large number of operations and far more memory. An objective of ITU-T standardization of the hierarchical extension to G.711 is to achieve low complexity.

SUMMARY

The present invention will improve the situation.

It proposes for this purpose a bit allocation method in hierarchical coding/decoding comprising coding/decoding of a digital audio signal enhancement layer. The digital audio signal comprises a succession of L samples, in which each sample is presented in the form of a mantissa and an exponent. The method comprises in particular the allocation of a predetermined number $N_b$ of enhancement bits to at least some of the L samples with the greatest exponent values.

The method comprises the following steps:
a) enumerating the exponents of the L samples each having a given value,
b) calculating at least one cumulative value of enumerations of exponents by decreasing exponent values until the predetermined number $N_b$ is approximated from above in order to
c) determine a threshold value for the greatest exponent (hereinafter notated "$iexp_0$") of a sample for which no further enhancement bit is available.

The actual allocation of the $N_b$ enhancement bits to samples the exponent of which is greater than the threshold value $iexp_0$ can then take place according to selected rules.

As seen in the embodiment examples described below with reference to the Figures, this determination of variable $iexp_0$ by decrementation of the number of bits available for allocation makes it possible to limit considerably the complexity of calculation of the bit allocation in comparison with the prior art set out above.

In an embodiment, according to the above mentioned selected rules, provision can be made for a maximum number $N_a$ of bits to be allocated for a sample and the following are reserved:
   $N_a$ bits for allocation to each sample the exponent of which is greater than a sum of the threshold value $iexp_0$ and the maximum number $N_a$,
   no bits for samples the exponent of which is less than or equal to said threshold value $iexp_0$, and
   a number of additional bits among the number $N_b$ of bits for allocation to samples the exponent of which is comprised between the threshold value $iexp_0$ plus one and the sum of the threshold value and of the maximum number $N_a$.

This provides for advanced bit allocation based on the exponent values of the samples.

In a particular embodiment, it may be decided to allocate to each sample the exponent of which is comprised between the threshold value plus one and the sum of the threshold value and the maximum number $N_a$:
- the difference between the exponent of a sample and the threshold value $iexp_0$,
- or this difference less one, depending on a selected criterion, such as for example a positional order of the sample in the succession of samples.

Nonetheless, for this category of samples, allocation variants are possible (for example, taking account of the proximity of samples or any other criterion).

For example, it is also possible, rather than favouring the first samples the exponent of which is within the range [iexp0+1, iexp0+Na], to favour the samples having the greatest exponent.

In the case where the number Na is predetermined, it may be considered that the samples the exponent of which is strictly greater than iexp0+Na can finally receive Na bits.

However, in an example embodiment, the number Na cannot be predefined, a priori. For example, the number Na can only be determined at the end of step b) above (intrinsically at the end of cumulation) and the implementation of step b) would then make it possible simply to know this number Na. Indeed, it is not necessarily possible to provide for a constraint on the number Na to verify that the allocation does not exceed the number Nb.

Generally, it will then be understood that the number of additional bits finally corresponds to the total number of bits to be allocated Nb, less the number of bits allocated to the samples the exponent of which is strictly greater than iexp0+Na (the number such samples being able to be zero). On the other hand, it is the determination of the above mentioned threshold iexp0 which makes it possible to ensure that this allocation does not exceed the number Nb. The allocation of Na bits to all the samples the exponent of which is greater than iexp0+Na can therefore not cause the allocation to "overflow" since the threshold iexp0 is calculated to avoid exceeding the number Nb of bits allocated.

In an embodiment, step b) for example can comprise:
b1) a determination of a greatest exponent value (hereinafter notated "$iexp_{max}$") among the L samples;
b2) a cumulation of the numbers of exponents from the greatest exponent value to the greatest value decremented $N_a$ times; and
b3) a conditional loop such that:
if the cumulation remains less than the total number of bits $N_b$ to be allocated to the L samples, this cumulation is added to a new cumulation calculated by implementation of operation b2) with decrementation of the greatest exponent value by one, the result of such decrementation being taken for the implementation of operation b2) as the greatest exponent value, with loop iteration of operation b2) as long as said cumulation resulting from operation b2) remains less than the number $N_b$,
otherwise, a number of additional bits remaining at an immediately preceding iteration of operation b2) is calculated in order to determine a number (L") of samples the exponent of which is comprised between the threshold value plus one and the sum of the threshold value and the maximum number $N_a$.

In an embodiment, bit allocation to the L samples can be performed by the execution of two loops:
a first loop until the bit allocation to samples having an exponent between the threshold value plus one and the sum of the threshold value and the maximum number $N_a$ has been performed, a number of iterations of the first loop being counted,
then, a second loop to perform the bit allocation of the last remaining samples, iterated a number of times which is a function of said number of iterations of the first loop.

In an embodiment, a table of exponent counters can be established in step a) and an address pointer in the table is advantageously decremented in a conditional loop for the implementation of step b).

Thus, the determination of the greatest exponent value ($iexp_{max}$) among the L samples can be performed efficiently by reading the above mentioned table.

In the coding in particular, the method may conventionally comprise the composition of a bitstream of an enhancement signal resulting from the coding of the enhancement layer. In an embodiment presented and discussed in Annex 2 below, this composition is advantageously carried out on the fly after bit allocation of each sample.

In a variant according to the embodiment presented in Annex 1 (called "first embodiment" hereinafter), the bit allocation data are first stored in a table and the composition of the bitstream is performed on the basis of this table.

The method is advantageously applied to coding/decoding by PCM (Pulse Code Modulation) type quantization according to the logarithmic amplitude compression coding law of type A or type µ in accordance with ITU-T Recommendation G.711.1.

The invention has an advantageous, (but of course non-limitative), application to signal processing by at least partial decoding, mixing and at least partial re-encoding of incoming bitstreams in a bridge architecture, in particular audio, for teleconferencing between several terminals. In such an application, the implementation of the second embodiment in particular is advantageous, as will be seen below.

The present invention can be implemented through the execution of a computer program comprising instructions for the implementation of the above method when they are executed by a processor and in this regard the invention relates to such a program, examples of flow charts for which are illustrated in FIGS. 5 to 9 discussed below.

As shown for reference in FIG. 11, the present invention also relates to a device COD for the encoding of an enhancement layer in a hierarchical coding of a digital audio signal and comprising computerized means (such as a processor PROC and a memory MEM typically) for the implementation of the coding method within the meaning of the invention and/or its above mentioned application.

The invention also relates to a device DEC for the decoding of an enhancement layer in a hierarchical decoding of a digital audio signal and comprising computerized means (such as a processor PROC' and a memory MEM') for the implementation of the decoding method within the meaning of the invention and/or its above mentioned application. The decoder and the above mentioned coder can be linked together by a channel C.

Thus, the present invention, based on hierarchical extension technology with dynamic bit allocation, can be used to reduce random-access memory and the number of calculations while retaining the quality obtained. In an embodiment presented in particular in Annex 1, the signals obtained are, at any point, compatible with those of the state of the art. The result is ease of implementation (saving memory and processing capacity) and consequently cost saving. The invention is in particular very useful for coding in teleconferencing systems.

Instead of performing bit allocation 1 bit by 1 bit, the invention determines directly for each sample the total number of enhancement bits to be allocated to it depending on its exponent. Advantageously, the invention does not use an exponent map, which reduces the random-access memory and also obviates numerous memory accesses and complex addressing operations. The invention determines the greatest exponent $iexp_{max}$ of the exponents of L samples and the greatest exponent $iexp_0$ of the samples which do not receive an enhancement bit. Then, from these two exponents, the total number of bits to be allocated to each sample is calculated.

In an embodiment, the application of the invention makes it possible to perform a dynamic bit allocation identical to the 1 bit-by-1 bit iterative procedure initially used in the G.711.1 coding/decoding of the prior art.

BRIEF DESCRIPTION OF THE DRAWINGS

Other advantages and features of the invention will become apparent on reading the description of embodiment examples presented below with reference to the drawings, in which.

DETAILED DESCRIPTION

A possible application of the invention relates to the coding of an enhancement layer in a hierarchical coding. This hierarchical coding comprises the coding of a base layer by quantization, according to an amplitude compression law, of a succession of L samples of a digital signal S (referenced in FIG. 2). The samples are coded over a predetermined number of bits comprising exponent bits and mantissa bits to obtain a first bit block of quantization indices ($I_{MIC}$), a predetermined number of least significant mantissa bits not being taken into account in the first block. In particular, the coding of the enhancement layer is meant to hold in a second bit block the most significant bits among the bits which are not taken into account in the first block, thus to deliver in this second block additional mantissa information for at least some of the above mentioned L samples. The coding of the enhancement layer typically comprises a calculation of the number of bits and their allocation to these samples to provide in the enhancement layer the additional mantissa information for these samples among the L samples, depending on the exponent of each of the L samples.

Figure 1:
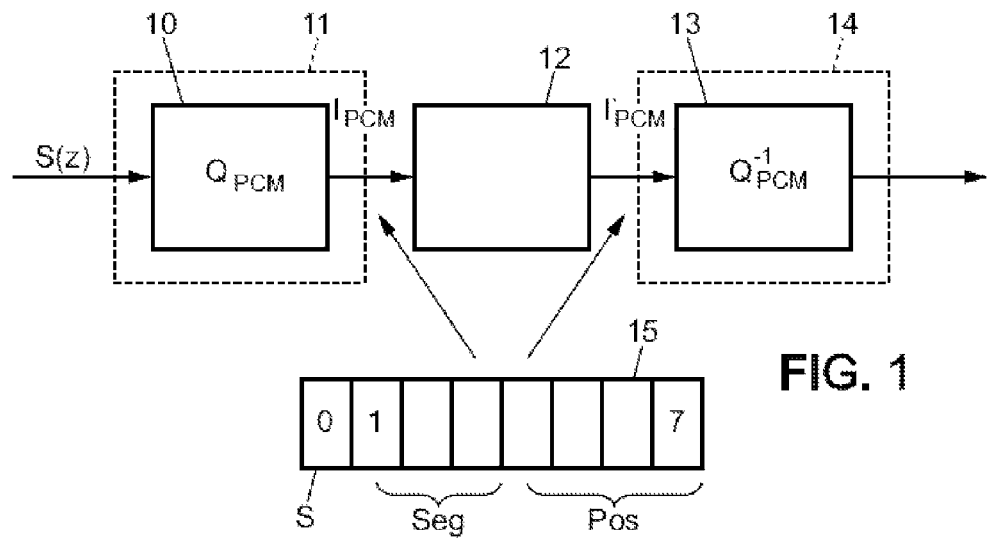
FIG. 1 shows a general example of a system for implementation of the method, with a coder 11 and a decoder 14 in a context of the invention, FIG. 2 details diagrammatically the structure of a hierarchical coder for the implementation of the invention.
Figure 2:
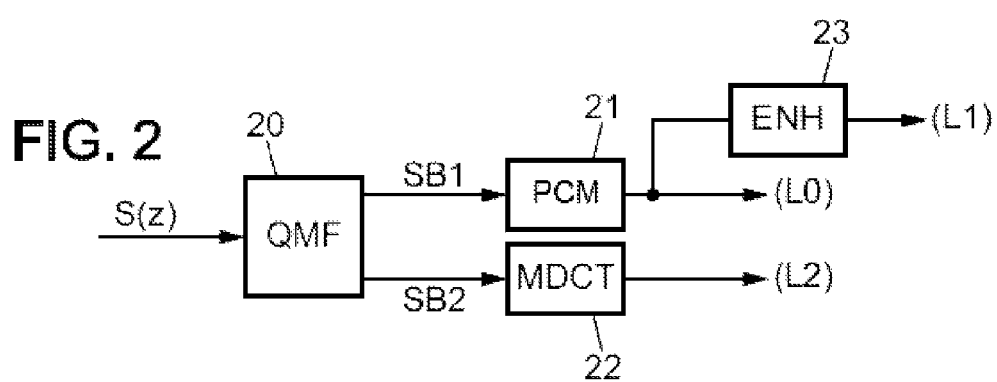
Figure 3:
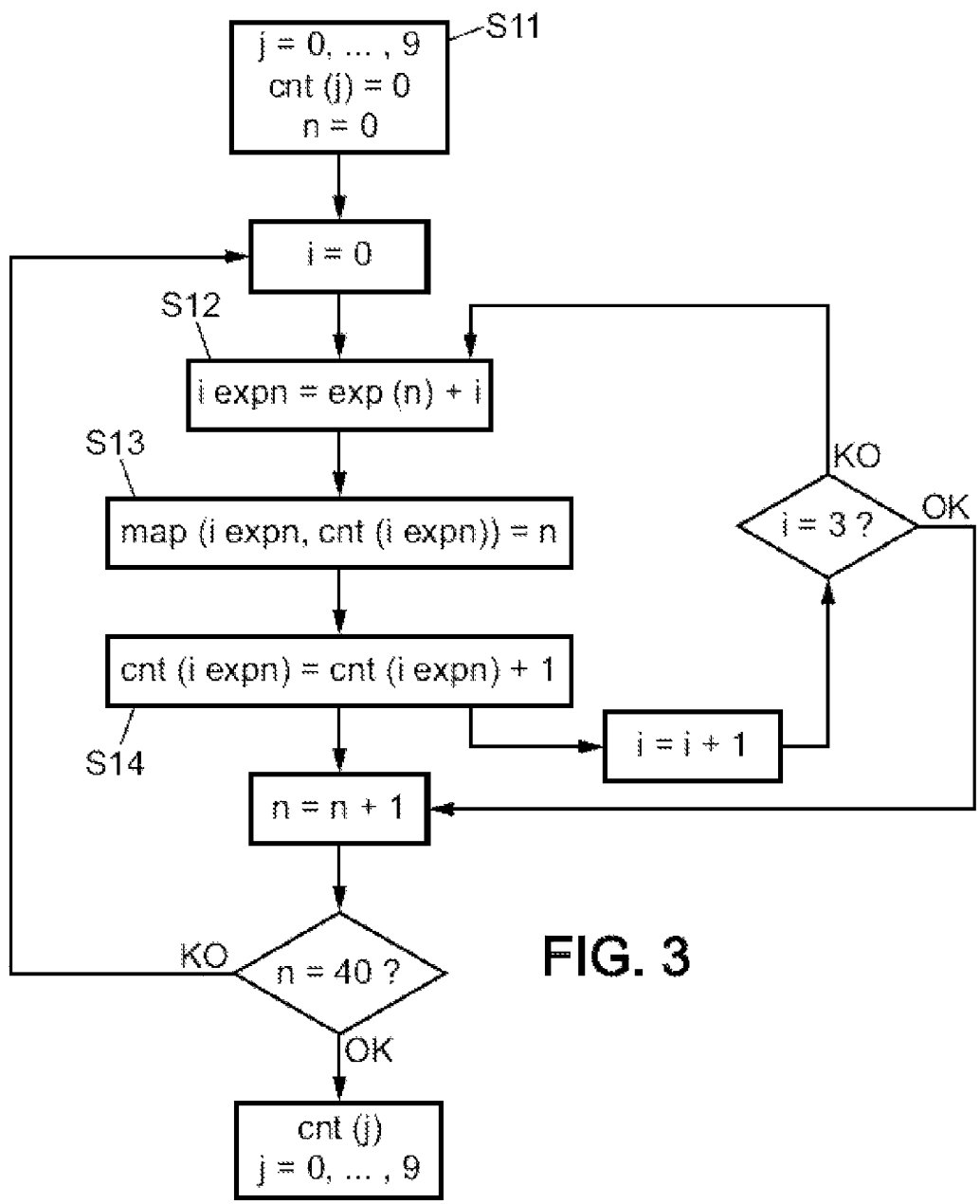
FIG. 3 shows the calculation of an exponent map and an exponent index counter table within the meaning of the prior art.
Figure 4:
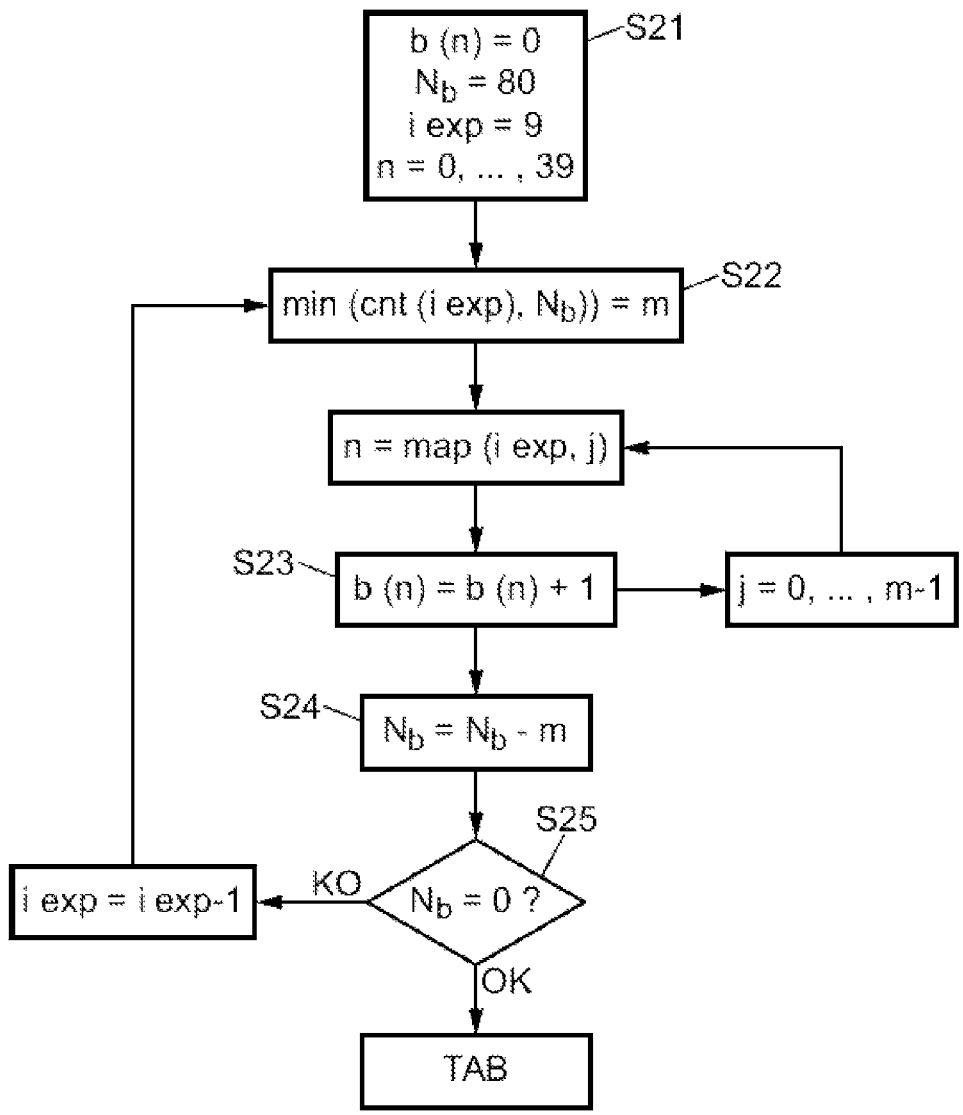
FIG. 4 shows the calculation of a bit allocation table within the meaning of the prior art.

Thus, in the example described, it is sought to allocate a total of $N_b$ additional bits to a maximum of L samples, depending on the exponent values of the L samples, in order to enhance the coding of the samples in the enhancement layer (layer "1" (L1)) of the hierarchical coding (performed by module 23 in FIG. 2).

The following notations are used below:
  $N_a$ the maximum number of additional bits to be allocated for a sample,
  $N_e$ the total number of exponent values and
  exp[L] the table containing the exponents of the L samples.

The bit allocation is generated using the exponents of the L samples, exp(n), with n=0, ..., L−1 (0≤exp(n)<$N_e$).

In a first phase, the exponents are enumerated, then, in a second phase, the bit allocation of the L samples is calculated.

More particularly, in an embodiment below, in the above mentioned first phase:
  the number of exponents having a given value is counted,
  these counters are stored in a table cnt0[$N_e$] (according to steps A) to C) described below),
  then, a table of cumulations of exponent counters cnt_cum [$N_e$+$N_a$−1] is calculated.

Figure 9:
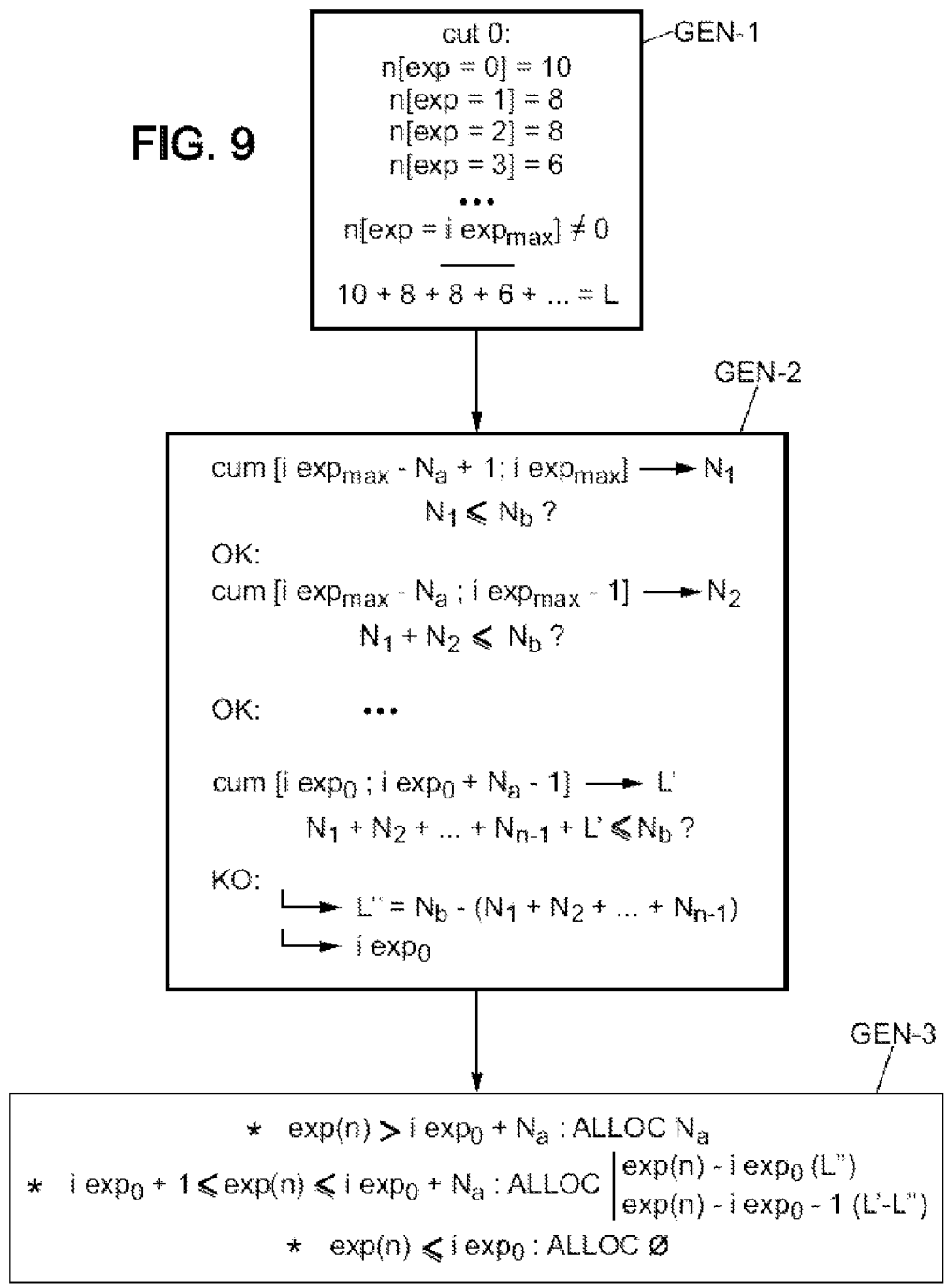

The general steps of the enhancement layer encoding method are shown in FIG. 9 in an example embodiment. In a first general step GEN-1, the table of exponent counters cnt0 is constructed. In the example shown, on the L samples of a block (or frame) of the original signal S(z) (with for example L=40):
  the number of samples with the exponent set at 0 is: 10,
  the number of samples with the exponent set at 1 is: 8,
  the number of samples with the exponent set at 2 is: 8,
  the number of samples with the exponent set at 3 is: 6,
  etc.
  until reaching an exponent value ($iexp_{max+}1$) for which no further sample remains.

Thus, the exponent value annotated $iexp_{max}$ is the greatest exponent value for which there is still at least one sample with exponent value $iexp_{max}$.

Of course, the sum of these numbers equals the number L of samples in a frame.

$N_a$ is used to denote the maximum number of additional bits which can be allocated to a sample (for example $N_a$=3). A search is then made for the value $iexp_0$, defined as being the greatest exponent of the samples which will not receive an enhancement bit: the bit allocation for samples with exponent less than or equal to $iexp_0$ is then 0 bit.

Thus, in a second general step GEN-2, an estimate is made, among the $N_b$ bits to be allocated in total, the number of bits to be reserved for future allocation to the samples the exponent of which is comprised between $iexp_{max}$ and $iexp_{max}$−$N_a$+1 (bearing in mind that one of these samples can only be allocated a maximum of $N_a$ enhancement bits).

Next, the exponent value in question is decremented and an estimate is made of the number of bits, among the bits remaining after the first incrementation of step GEN-2, which would remain to be allocated to the samples with exponent comprised between $iexp_{max}$−1 and $iexp_{max}$−$N_a$. Here again, a maximum of $N_a$ enhancement bits could subsequently be allocated to each sample if, of course, enough bits remain able to be allocated among the $N_b'$ additional bits after the above mentioned first incrementation.

This decrementation is continued until a population of samples is achieved the exponent of which is comprised between $iexp_0$ and $iexp_0+N_a-1$ and for which the number of remaining bits $N_b'$ is no longer sufficient to satisfy the allocation of a maximum of $N_a$ bits to each of these samples. Thus, the number L' in FIG. 9 represents the number of bits counted for one implementation too far of the above mentioned decrementation. This number L' also corresponds to the number of samples the exponent of which is comprised between $iexp_0$ and $iexp_0+N_a-1$ and is given by the cumulation of exponents $cnt\_cum[iexp_0+N_a-1]$ for which an allocation of $(exp(n)-iexp_0)$ bits per sample is not assured. Among these L' samples, the number L" relates to the samples for which an allocation of $(exp(n)-iexp_0)$ bits per sample is possible.

Thus, the samples the exponent of which is greater than $iexp_0+N_a$, will be allocated $N_a$ bits each during a subsequent bit allocation step GEN-3 but, for the samples the exponent of which $exp(n)$ is comprised within the range $[iexp_0+1, iexp_0+N_a]$, allocation could be $exp(n)-iexp_0$ (for L" samples) or $exp(n)-iexp_0-1$ (for the L'-L" remaining samples). As mentioned above, for this category of samples, allocation variants are possible. In a particular embodiment, allocation takes place simply according to their order "of appearance" in the frame of L samples. The samples processed first among these remaining samples will then be the first served during the allocation of enhancement bits. Finally, the samples the exponent of which is less than or equal to the threshold value $iexp_0$ do not benefit from any supplementary bit.

Figure 5:
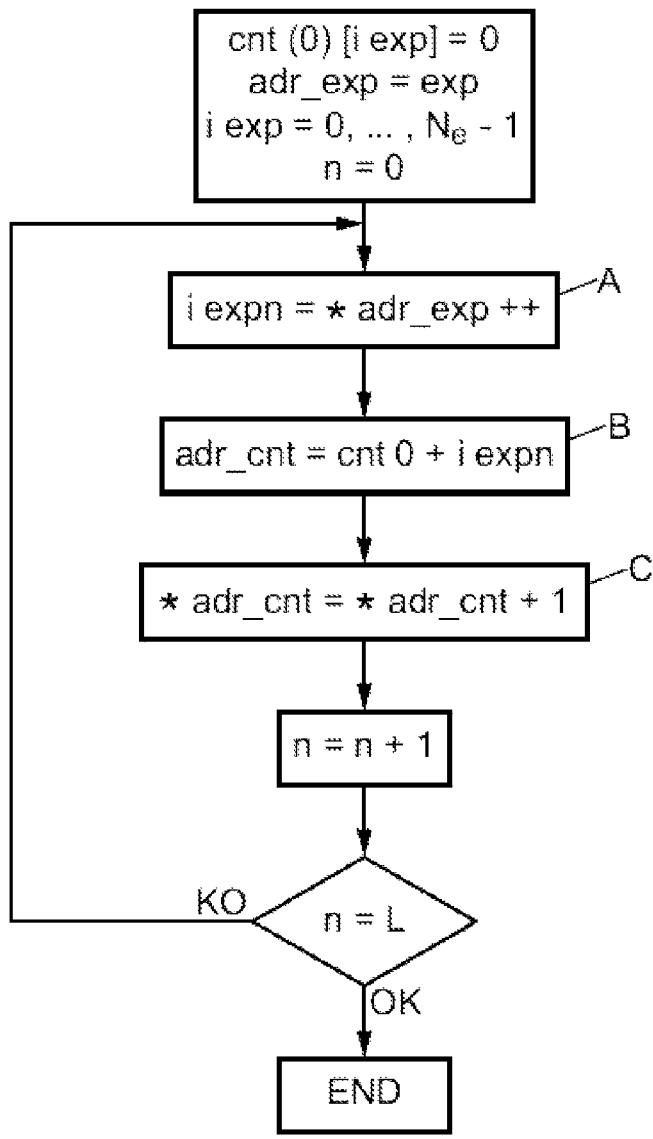
FIG. 5 shows an example flow diagram for the construction of an exponent counter table in a first step according to an embodiment of the invention.

Thus, the first general step GEN-1 consists of constructing the exponent counter table, as described in detail below, as an example embodiment, with reference to FIG. 5.

The table of counters cnt0 is first reset to zero (with $N_e$ memory accesses): $cnt0[iexp]=0$, for $0 \le iexp < N_e$.

A pointer adr_exp in the table of exponents is also reset to the address of $exp(0)$: adr_exp=exp.

Then, in a loop on the L samples ($0 \le n < L$), the following operations are performed:

A) memory access to obtain iexpn the exponent of sample n (and increment by 1 of pointer adr_exp to point to the address of the exponent of the next sample): iexpn=*adr_exp++

B) addressing in the table of counters to point to the address adr_cnt of cnt0(iexpn): adr_cnt=cnt0+iexpn C) increment by 1 (addition) of the exponent counter value contained at the address adr_cnt: *adr_cnt=*adr_cnt+1

Operations A), B), C) are performed L times. In comparison with the method of the prior art described above, there is no internal loop or costly addressing of a two-dimensional table.

Once table cnt0 has been calculated, table $cnt\_cum[N_e+N_a-1]$ of the cumulation of exponent counters is calculated:

$$cnt\_cum[j] = \sum_{i=max(0,j-(N_e-1))}^{min(j,N_a-1)} cnt0[j-i], \ 0 \le j < N_e + N_a - 1$$

This expression is broken down in practice into three cases, depending on the limits of summation:

$$cnt\_cum[j] = \sum_{i=0}^{j} cnt0[j-i], \ 0 \le j < N_a$$

$$cnt\_cum[j] = \sum_{i=0}^{N_a-1} cnt0[j-i], \ N_a \le j < N_e$$

$$cnt\_cum[j] = \sum_{i=j-(N_e-1)}^{N_a-1} cnt0[j-i], \ N_e \le j < N_e + N_a - 1$$

Three loops corresponding to the three cases could be performed. However, in an advantageous variant making it possible to limit the number of instructions (to be stored in program memory PROM) and thus have a reasonable program memory size, it may be preferable to have a table of exponent counters cnt0_a of size $N_e+2N_a$ (therefore with an increase of $2N_a$ words only). The reset to zero step then comprises $2N_a$ supplementary memory accesses and the definition of a pointer cnt0 which points to address cnt0_a+$N_a$. Steps A) to C) remain the same. With this table of a slightly increased size, calculation of the cumulation table of exponent counters is presented as follows:

a pointer adr_cnt0 on the table of exponent counters is reset to cnt0 (=cnt0_a++$N_a$), thus to the address of cnt0(0), (cnt0(0) then being the number of samples with 0 as exponent), and a second pointer adr_cnt_cum is reset to the address of cnt_cum(0) (adr_cnt_cum=cnt_cum).

Figure 6:
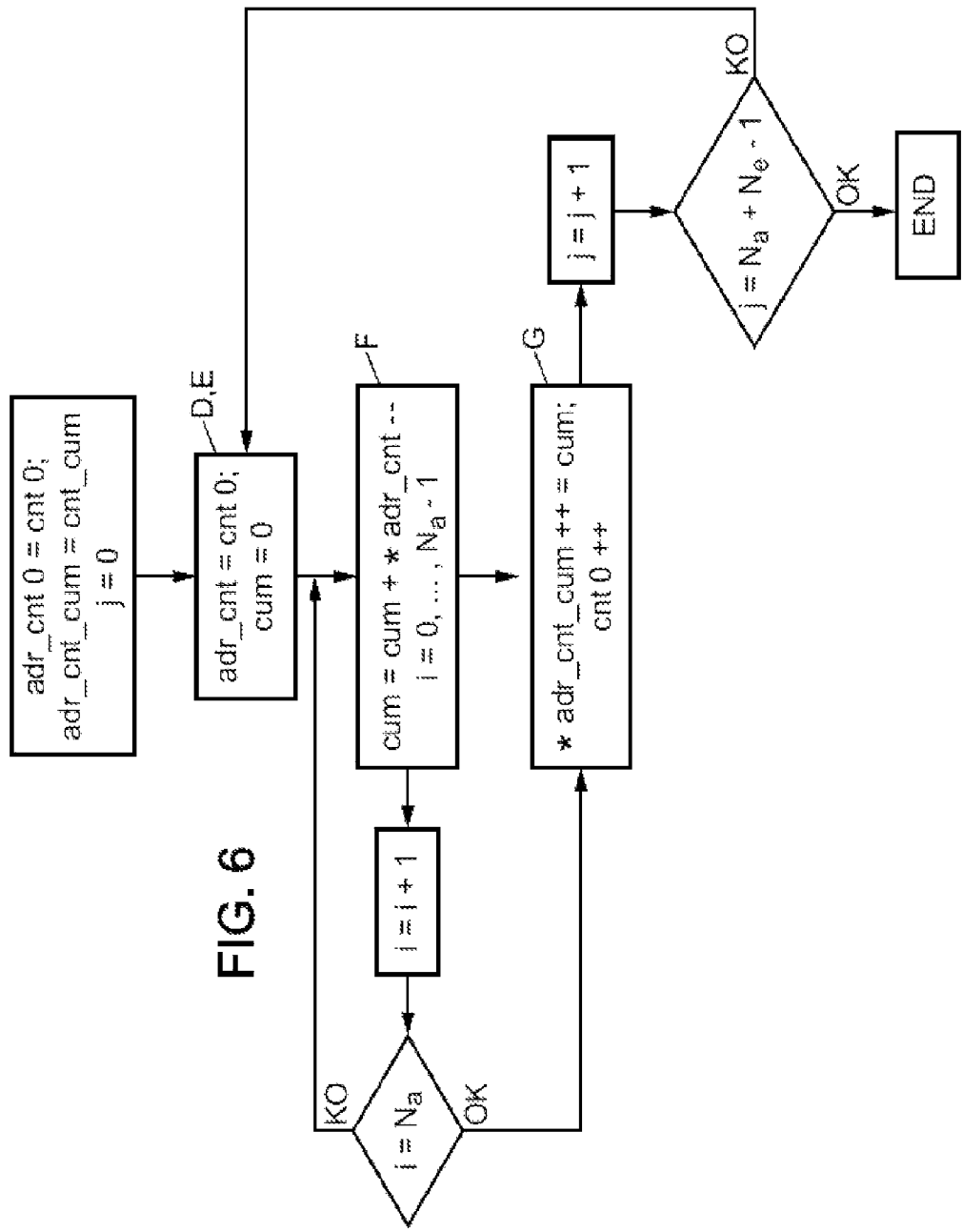
FIG. 6 shows an example of a flow diagram for the calculation of a cumulation of exponent counters according to a next general step, within the meaning of the invention.

Then, in a loop on the $N_e+N_a$ cumulations ($0 \le j < N_e+N_a-1$), the following operations are performed, with reference to FIG. 6:

D) resetting of a second pointer adr_cnt on table cnt0_a: adr_cnt=cnt0

E) resetting of variable cum to zero: cum=0

F) loop to cumulate the $N_a$ counters ($0 \le i < N_a$): at each iteration of this loop, the value of the counter at the current address adr_cnt is added to variable cum then the address adr_cnt is decremented by 1: cum=cum+*adr_cnt--.

G) at the output of the internal loop F), variable cum is stored at address adr_cnt_cum, and the two pointers adr_cnt_cum and cnt0 are post-incremented by 1: *adr_cnt_cum++=cum and cnt0++.

Variants can be provided to calculate this table of cumulations efficiently.

For example, rather than resetting variable cum to zero and performing the internal loop F) $N_a$ times, it can be performed one less time ($0 \le i < N_a-1$), by resetting the variable cum at step E) with the value of the counter at address adr_cnt followed by decrementing this pointer by 1: cum=*adr_cnt--.

Similarly, it is possible to separate the calculation of the $N_a$ first cumulations from the last $N_e$ by performing two loops:

with resetting of variable cum to 0, then over $N_a$ iterations ($0 \le j < N_a$), adding the value of the counter at the current address cnt0 to the variable cum, storing the variable cum at the address adr_cnt_cum, the two pointers adr_cnt_cum and cnt0 both being post-incremented by 1: cum+=*cnt0++ and *adr_cnt_cum++=cum;

with a second loop (on j, with $N_a \le j < N_e+N_a-1$) similar to the loop described in steps D) to G) in which the initial pointers adr_cnt_cum and cnt0 are those obtained at the output of the first loop ($0 \le j < N_a$).

In this variant, fewer calculations are counted and the size of the table cnt0_a is ($N_e+N_a$) then corresponding to a reduction by $N_a$ words (pointer cnt0 then being reset to the address of the first element of cnt0_a: cnt0=cnt0_a), but the program memory is increased by the instructions of the first loop.

The cumulation table can also be constructed by a recurrence relation, the cumulation at the current iteration being obtained by subtracting a counter and adding a counter to the cumulation calculated at the preceding iteration, as follows:

$$cnt\_cum[j+1]=cnt\_cum[j]-cnt0[j-N_a]+cnt0[j+1]$$

It will be understood that, according to the compromise sought between complexity, random-access memory size and program memory size, it is possible to combine different variants.

For example, it is possible to combine the variants of two separate loops for calculating the table of cumulations, resetting cumulation not to zero but with the value cnt0(0) and use of the recurrence relation. In this case, variable cum at the output of the first loop over the first $N_a$ cumulations is used to calculate the first iteration of the recurrence relation in the second cumulation calculation loop.

The exponent counter cumulation table obtained by the technique according to the invention corresponds to the exponent index counter table of the prior art, but calculation thereof does not require the costly exponent index map (costly in both memory and complexity).

A description is now given of the calculation of the bit allocation table.

In order to avoid the costly bit-by-bit bit allocation, the total number of bits allocated to a sample is allocated in one go. This number of bits is determined as a function of the exponent of the sample, the greatest exponent ($iexp_{max}$) of the exponents of the L samples and the greatest exponent $iexp_0$ of the samples which do not receive an enhancement bit, bearing in mind that bit allocation for the samples with exponent less than or equal to $iexp_0$ is 0 bit (as described above with reference to step GEN-2 in FIG. 9).

The first two steps therefore consist of finding these two exponents $iexp_{max}$ and $iexp_0$.

In order to find the greatest exponent $iexp_{max}$ among the exponents of the L samples, a loop can be performed on the L exponents of the samples to determine the greatest exponent.

By way of example procedure, there can be mentioned a pseudo-code using basic operator instructions according to ITU-T Recommendation G.191 ("Software tools for speech and audio coding standardization", March 2010), such instructions being discussed in the table below:

```
ptr_exp = exp;
iexp_max = 0;
FOR(n=0; n<L; n++) {
    temp = sub(iexp_max, *ptr_exp);
    if(temp < 0) {
        iexp_max = *ptr_exp; move16( );
    }
    ptr_exp++;
}
```

The "FOR" instruction, for example, therefore corresponds to a loop performed L times here, with a number of times known before entering the loop. This instruction has a complexity weighting of "4" for the entire loop. On the other hand, the "WHILE" instruction corresponds to a conditional loop (the number of times is not known before entering the loop) and the instruction has a complexity weighting of "4" at each iteration of the loop. It will then be understood that the use of the "FOR" instruction in the pseudo-code above is more advantageous.

Similarly, in the pseudo-code above, the "if" instruction (in lower case) corresponds to a unique test followed by a sole operator with a single base. In this case, the cost of such a test is negligible. Such is not the case for an "IF" test in particular, when several instructions or a complex operation (such as a function call) are to be performed conditionally downstream of the test. The "IF" instruction (in upper case) typically has a weighting of "4". Furthermore, if this test is not verified ("if not" branch at the output of the test), instructions have to be performed downstream. The "ELSE" instruction which corresponds to this case typically has a weighting of "4". The table below summarizes, for several types of instruction, their complexity weighting.

| Instructions | Complexity weighting | Instruction label |
|---|---|---|
| Memory access (write or read) | 1 | move16( ) |
| Addition/subtraction | 1 | add( )/sub( ) |
| Bit offset to left/right (multiplication/division by a power of 2) | 1 | shl( )/shr( ) |
| "or" bit-to-bit logic | 1 | s_or |
| Comparison of two values and selection of the greatest/the smallest | 1 | s_max( )/s_min( ) |
| Multiplication by a non-power of 2 | 3 | i_mult( ) |
| "Simple" test (followed by a sole operator with single base) | 0 | If |
| "Complex" test (followed by several instructions) or an "ELSE" | 4 | IF |
| "Complex" test with instructions if not verified | 4 | ELSE |
| Loop performed a constant N number of times | 4 | FOR |
| Loop performed a variable N number of times (output of conditional loop) | 4N | WHILE |

Figure 7:
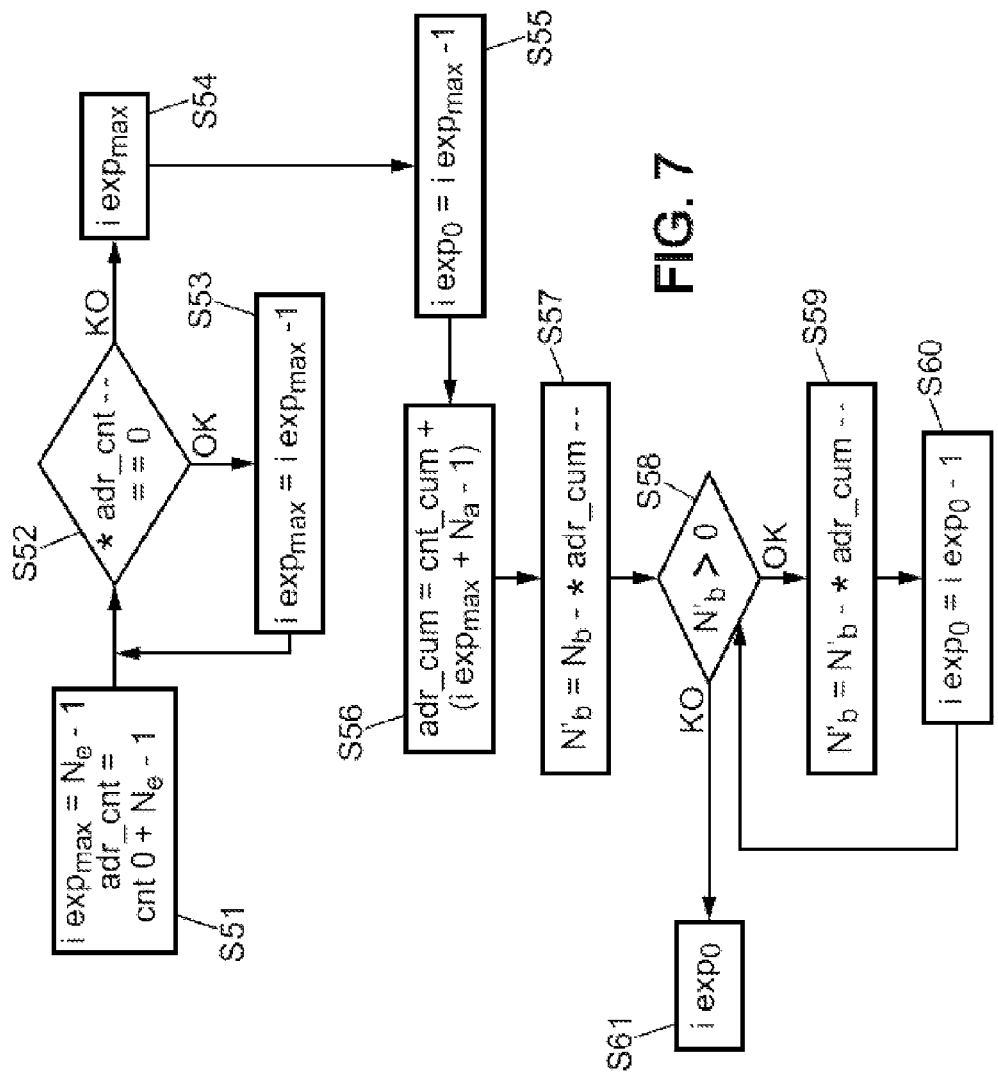
FIG. 7 shows an example flow diagram for the calculation of variable $iexp_0$ corresponding to the greatest exponent of the samples which will not receive an enhancement bit.

Advantageously, the number of exponents $N_e$ generally being smaller than the number of samples L, it is preferable to look in the counter table $cnt0[N_e]$ for the last non-zero element. With reference to FIG. 7, proceed in step S51 to a reset of the variable $iexp_{max}$ to $(N_e-1)$ and of the pointer adr_cnt to the address of the element $cnt0[N_e-1]$:

$$iexp_{max}=N_e-1; adr\_cnt=cnt0+N_e-1;$$

Next, a conditional search loop in the table $cnt0[N_e]$ is performed, with a test on the value of the counter at address adr_cnt followed by a post-decrementation of this pointer (step S52):
- if the tested value is zero, decrementation by 1 of $iexp_{max}$ (step S53) and passing to the next iteration,
- if not, at loop output, the value $iexp_{max}$ at the output of the loop is the greatest exponent among all the exponents of the L samples (step S54).

The corresponding pseudo-code is:

$$WHILE(*adr\_cnt--==0)iexp_{max}=sub(iexp_{max},1)$$

The next step consists of looking for the greatest exponent $iexp_0$ of the samples not receiving an enhancement bit (0 bit). To do this, starting from an exponent $iexp_0$ equal to exponent $iexp_{max}-1$ (step S55), from a pointer on the exponent counter cumulation table reset to the address of $cnt\_cum[iexp_{max}+N_a-1]$ (step S56) and from a number of bits remaining to be allocated $N'_b$ equal to "$N_b-cnt\_cum[iexp_{max}+N_a-1]$" (step S57), a conditional loop is performed with a test on $N'_b$: as long as $N'_b$ is strictly positive ($N'_b>0$ at test S58), the loop is iterated and $N'_b$ is decremented by $cnt\_cum[iexp_0+N_a-1]$ (step S59), then $iexp_0$ is decremented by 1 (step S60). The pseudo-code below gives an example of the procedure in accordance with the representation in FIG. 7:

```
iexp₀= sub(iexp_max,1);
adr_cum = cnt_cum+(iexp_max+N_a−1);
N'_b= sub(N_b,*adr_cum--);
WHILE (N'_b > 0) {
    N'_b = sub(N'_b, *adr_cum--);
    iexp₀ = sub(iexp₀,1);
}
```

Thus, at each iteration, adr_cum points to the address of cnt_cum[iexp$_0$+N$_a$−1] which gives the number of samples having exponents iexp$_0$+i, with i=0, . . . , N$_a$−1.

A reset, iexp$_{max}$ being the greatest exponent of the L samples, adr_cum points to address cnt_cum[iexp$_{max}$+N$_a$−1] which therefore gives the number of samples having exponent iexp$_{max}$ (since no sample has exponent iexp$_{max}$+1, iexp$_{max}$+2, iexp$_{max}$+N$_a$−1).

Then, at the first iteration, adr_cum points to the address of cnt_cum[(iexp$_{max}$+N$_a$−2)] which gives the number of samples having exponents either iexp$_{max}$ or (iexp$_{max}$−1).

At the last iteration (at the output of this conditional loop at step S61), exponent iexp$_0$ is the greatest exponent for which the samples receive 0 bit (no bit thus being allocated to the samples the exponent of which is less than or equal to iexp$_0$).

It should be noted that iexp$_0$ can be negative, in which case all the samples will be allocated at least one bit.

The bit allocation for each sample then depends on the difference between its exponent and the number iexp$_0$. The samples the exponent of which is equal to iexp$_0$+1 will receive 1 or 0 bit, depending on the number of bits remaining to be allocated.

More generally, the samples the exponent of which are equal to iexp$_0$+i, 1≤i≤N$_a$ receive i or (i−1) bits, while the samples the exponent of which are strictly greater than iexp$_0$+N$_a$ will receive N$_a$ bits. For the samples the exponent of which exp(n) are comprised within the range [iexp$_0$+1, iexp$_0$+N$_a$], allocation can be exp(n)−iexp$_0$ or exp(n)−iexp$_0$−1. The number of samples the exponent of which are within this range is given by cumulation of the exponents cnt_cum[iexp$_0$+N$_a$−1] and finally corresponds to the number L' presented above with reference to FIG. 9, namely:

$$L'=cnt\_cum[iexp_0+N_a-1]$$

Among these L' samples, the number L" of samples allocated a number of bits equal to the value of their exponent reduced by iexp$_0$ (i.e. exp(n)−iexp$_0$) is given by:

$$L'' = N_b - \sum_{j=iexp_0+1}^{iexp_{max}} cnt\_cum[j+N_a-1] =$$

$$N'_b + cnt\_cum[iexp_0 + N_a - 1] = N'_b + L'$$

(with N'$_b$ negative or zero at the output KO from test S58).

The present invention offers great flexibility in the choice of these L" samples allocated a number of bits equal to the value of their exponent reduced by iexp$_0$. In an embodiment, the choice of the L" samples among these L' samples makes it possible to obtain a bit allocation identical to the bit-by-bit allocation in G.711.1 as described in the prior art. This choice consists of taking the first L" samples the exponent of which is within the above mentioned range.

A description is now given of the calculation of bit allocation itself

Bit allocation to the L samples is performed in the example embodiment below through the execution of two loops:

a first loop until the bit allocation to the first L" samples with exponents within the range [iexp$_0$+1, iexp$_0$+N$_a$] has been performed, then a second loop to perform bit allocation for the last remaining samples.

The number of times the first loop is performed depends on the number L" as well as the position of these L" samples among the L samples. The number of times this loop has to be performed is therefore not known before entering this loop. On the other hand, the number of times, denoted "N" that the second loop has to be performed can be determined before entering this second loop based on the number of times the first loop was performed.

Figure 8A:
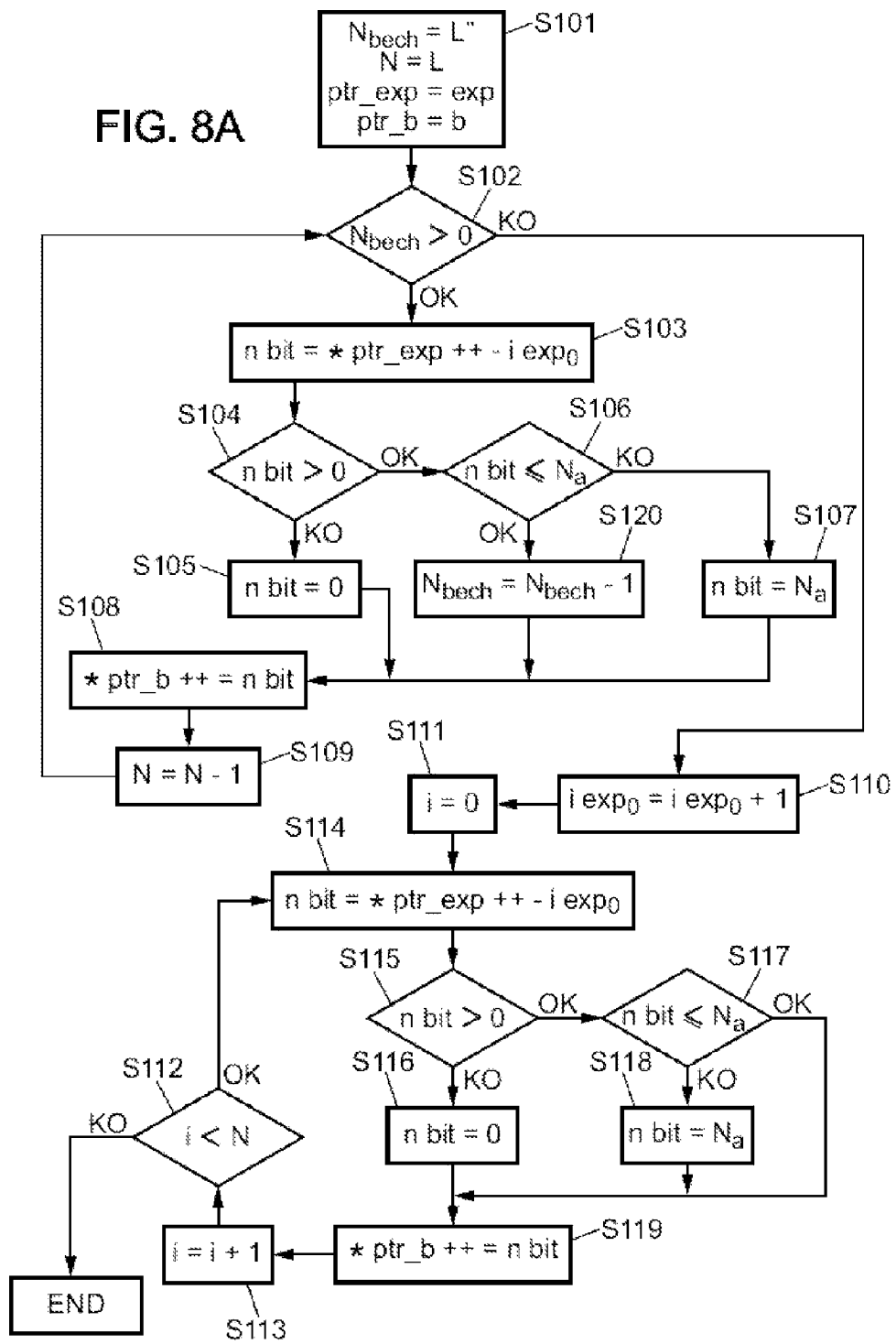
FIG. 8A shows an example flow diagram for the bit allocation procedure according to an embodiment.

The bit allocation procedure according to the invention can then be performed with reference to FIG. 8A, starting with a reset step S101:

of the sample counter Nbech having an exponent within the range [iexp$_0$+1, iexp$_0$+N$_a$] to L", of the number of times N the second loop has to be performed to L, of two pointers ptr_exp and ptr_b to start the bit allocation by the first sample, with:

ptr_exp pointing to the first element of the exponent table (&exp[0]=exp,exp[0] being the exponent of the first sample), ptr_b pointing to the first element of the bit allocation table (&b[0]=b,b[0] being the bit allocation of the first sample).

In the first loop (with the test S102 relating to Nbech):

the difference (nbit) between the exponent of the n$^{th}$ sample and iexp$_0$ is first calculated (step S103), then, this difference is given a lower limit of zero (steps S104 and S105).

if this difference is strictly positive (output OK from test S104), another test S106 is performed to determine whether this difference is less than or equal to N$_a$:

if so, the exponent of the sample is within the range [iexp$_0$+1, iexp$_0$+N$_a$]) and the counter Nbech is decremented by 1 (step S120), if not, the difference is given an upper limit of N$_a$ (step S107)

nbit is then the bit allocation of the n$^{th}$ sample (step S108), and the counter N is decremented by 1 (step S109).

As long as Nbech is strictly positive (arrow OK coming from test S102), passing to the next iteration takes place. If not (Nbech=0, corresponding to output KO), the bit allocation of the last of the L" first samples with their exponent within the range [iexp$_0$+1, iexp$_0$+N$_a$] has just been determined (step S108) and the conditional loop on Nbech is exited in order to enter the second loop and perform the bit allocation of the N last samples.

It should be stated here that the term "if not" at the output of test S106 can imply the instruction "ELSE", which habitually follows the "IF" instruction in test S106. Such an embodiment is clearly illustrated in FIG. 8A by way of explanatory example. However, in practice, it is pointed out that these two instructions ("IF" and "ELSE") each have a complexity weighting of 4. It is then preferred, in programming practice, always to place an upper limit on the difference (the weighting of a "s_max" instruction being 1). The test of the difference with respect to the value N$_a$, (step S106) is then a simple "if" test (in lower case, the meaning of which is set out in the table above). Thus, in practice, limits are preferentially used (s_min, or s_max) for comparison of "n bit" with 0 or N$_a$.

Figure 8B:
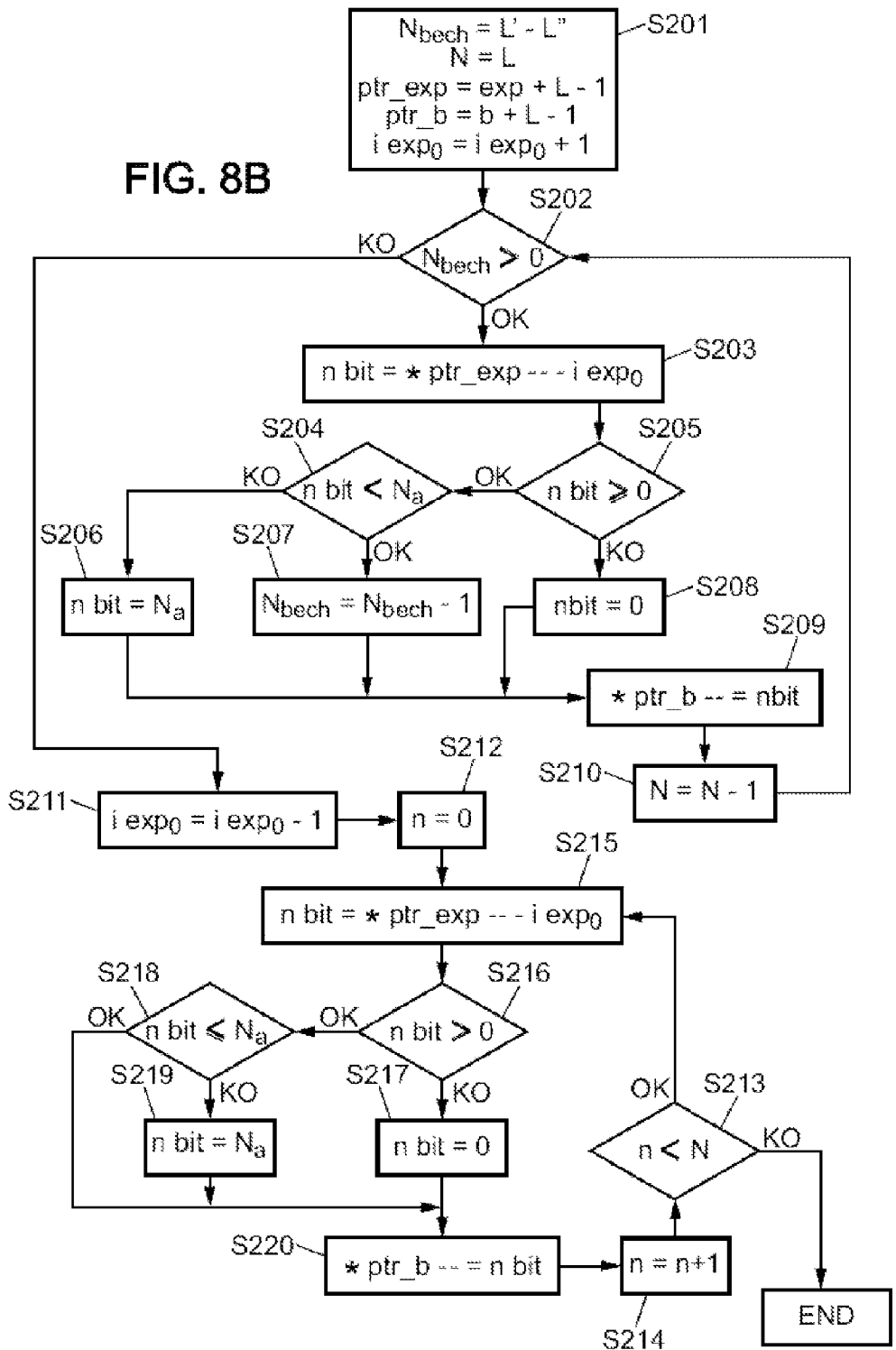
FIG. 8B shows an example flow diagram for the bit allocation procedure according to a variant embodiment, FIG. 9 summarizes an example general flow diagram for the enumeration of bits to be allocated to L samples of a frame.

Nonetheless, in order to clarify FIGS. 8A and 8B, instructions of the IF-ELSE type have been shown therein.

It will also be noted that as the pointers ptr_exp and ptr_b, have been post-incremented, they point respectively to the exponent of the next sample and to its bit allocation.

In the second loop, the number of bits allocated to a sample having its exponent within the range [$iexp_0+1$, $iexp_0+N_a$] is equal to the value of that exponent reduced by ($iexp_0+1$) (i.e. therefore $exp(n)-iexp_0-1$). The number of bits allocated to the other samples is:

0 for the samples having an exponent less than or equal to $iexp_0+1$, or $N_a$ for the samples having an exponent strictly above $iexp_0+N_a$.

In order to make the processing of the last N samples uniform, $iexp_0$ is incremented by 1 before entering the loop (step S110) and, in this second loop, it is then sufficient to limit the difference between the exponent of a sample and this value incremented by $iexp_0$ between 0 and $N_a$.

Thus, in the second loop (defined on i ranging from 0 (step S111) to N):

the difference (nbit) between the exponent of the $n^{th}$ sample and $iexp_0$ is first calculated in step S114, the difference is limited between 0 and $N_a$ (steps S115 to S118), nbit is then the bit allocation of the $n^{th}$ sample (step S119).

Here again, steps S115 to S118 are represented by instructions of the "IF" and "ELSE" types by way of illustration. However, in programming practice the use of imposed limits is preferred.

The loop is iterated N times (with the increment of step S113 and the test S112 on i) in order to perform the bit allocation of the last N samples.

The pseudo-code for the bit allocation according to FIG. 8A is given below:

```
Nbech=L";
N=L;
ptr_exp = exp;
ptr_b = b;
WHILE (Nbech > 0) {
   nbit = sub(*ptr_exp++, iexp0);
   nbit = s_max (nbit,0);
   IF(nbit> 0) {
      if(sub(nbit, Na) <= 0) Nbech = sub(Nbech, 1);
      nbit = s_min(nbit, Na);
   }
   *ptr_b++ = nbit;
   N= sub(N, 1);
}
iexp0 = add(iexp0,1);
FOR(n=0; n<N; n++) {
   nbit = sub(*ptr_exp++, iexp0);
   nbit = s_max(nbit, 0);
   nbit = s_min(nbit, Na);
   *ptr_b++ = nbit;
}
```

It will be seen, in the pseudo-code above, that nbit has initially, and retains, a lower limit of 0, before testing nbit>0 (in test S104), still in order to avoid the use of an "ELSE" instruction with a weighting of 4.

Since the conditional loop of the "WHILE" type is more complex than the "FOR" loop, it may be preferable to favour iterations of the FOR loop to the detriment of the WHILE loop and thus, depending on the values of L" and L' (for example if L">L'/2), bit allocation can be performed starting with the last sample. This variant corresponds to the pseudo-code given below, according to FIG. 8B, with the steps:

S201 reset step:

```
Nbech = sub(L',L");
N = L;
ptr_exp = exp+ L-1;
ptr_b = b+ L-1;
iexp0 = add(iexp0,1);
- from loop S202 on Nbech: WHILE (Nbech > 0) {
   nbit = sub(*ptr_exp--, iexp0) (step S203);
   IF(nbit>= 0) (test S205) {
      if(sub(nbit, Na) <0) ( test S204) Nbech = sub(Nbech, 1) (step S207);
      nbit = s_min(nbit, Na) (step S206);
   }
   nbit = s_max (nbit,0) (step S208);
   *ptr_b-- = nbit (step S209);
   N= sub(N, 1) (step S210);
}
iexp0 = sub(iexp0,1) (step S211 at the output of the loop on Nbech in order to execute the second loop below on n);
FOR(n=0 (step S212); n<N (test S213); n++ (increment S214)) {
   nbit = sub(*ptr_exp--, iexp0) (step S215);
   nbit = s_max(nbit, 0) (steps S216 and S217);
   nbit = s_min(nbit, Na) (steps S218 and S219);
   *ptr_b-- = nbit (step S220);
}
```

Once the bit allocation has been determined, the adaptive multiplexing procedure for the layer "1" (L1) enhancement signal can be performed as in the state of the art.

However, the invention offers another advantage. It makes it possible to perform the generation of bit allocation and adaptive multiplexing in a single pass. Indeed, in the state of the art, since the bit allocation of a sample is not known until the end of the 1 bit-by-1 bit iterative allocation of all the bits to be allocated, the adaptive multiplexing of the enhancement bits of the samples can only take place after the end of the iterative bit-by-bit allocation for all the samples. Such is not the case in the present invention, which determines the bit allocation of a sample in one go.

It is then possible to perform the adaptive multiplexing sample by sample, on the fly, without waiting to determine the allocation of all the bits. The combination of the two steps of generation of the bit allocation and of the adaptive multiplexing makes it possible to further reduce the random-access memory requirement and the complexity: it is unnecessary to store the bit allocation of the L samples, thus giving a memory saving corresponding to the above mentioned table b(L) and the 2L memory accesses needed to write and read the number of bits allocated to the L samples.

Since the complexity is thus reduced, the invention provides for numerous applications and in particular signal processing in an audio bridge architecture for teleconferencing, with decoding, mixing and re-encoding of incoming bitstreams, as described below.

More generally, the present invention offers numerous advantages. It offers several variants to obtain different compromises between complexity, random-access memory and read only memory (programmed code). In all cases, the savings in random-access memory (RAM) and in complexity are great. These savings are obtained without degradation of quality since the invention makes it possible, in a particular embodiment, to achieve the same adaptive bit allocation as the bit-by-bit iterative procedure of the state of the art, which makes it possible to ensure compatibility with the codecs of the state of the art.

One of the advantageous applications of the invention is high quality audio teleconferencing. In the case of a centralized communication architecture based on a multipoint control unit (MCU), an audio bridge performs decoding of the incoming bitstreams as well as their mixing, then re-encodes the mixed signals to send them to remote terminals.

Depending on the number of streams to be processed, the complexity can be great. In order to limit this complexity, a partial mixing technique can be provided to mix the coded streams according to the G.711.1 standard. Thus, in a context of hierarchical coding within the meaning of G.711.1, rather than decoding the bitstreams entirely, only the core layers (G.711 compatible) are decoded and mixed, before being re-encoded, the enhancement layers (lower and higher) not being decoded. It is possible, as a variant, to select an active stream among all the incoming streams and retransmit to other remote terminals its enhancement layers combined with mixed and re-encoded core layers. This partial mixing technique makes it possible to reduce the complexity considerably while guaranteeing the continuity of the mixing at the core layer level, since only the enhancement layers are switched. However, the enhancement of the communication quality provided by the extension layers is lost.

Figure 10:
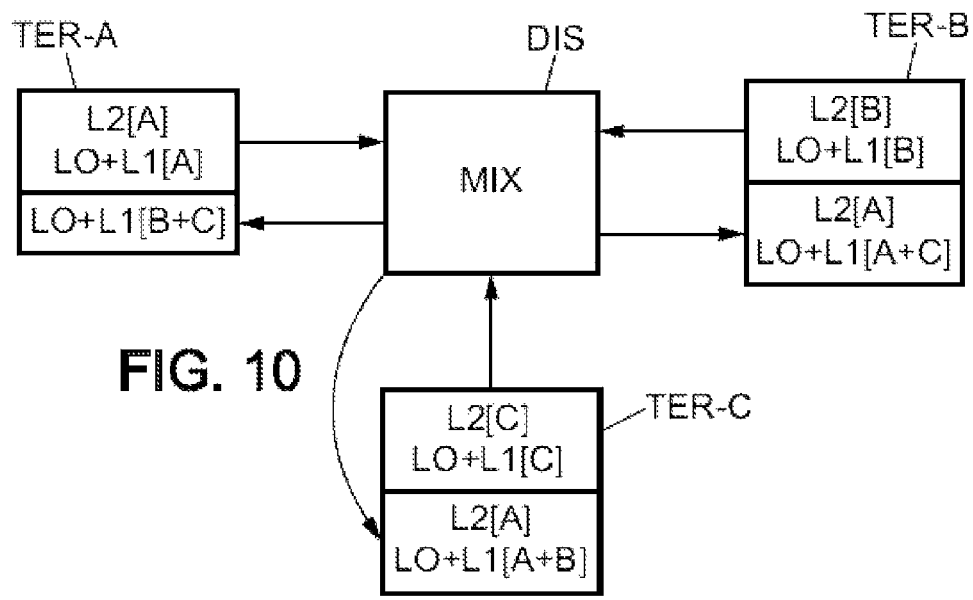
FIG. 10 shows schematically the application of the invention to a teleconferencing bridge between several terminals.
Figure 11:
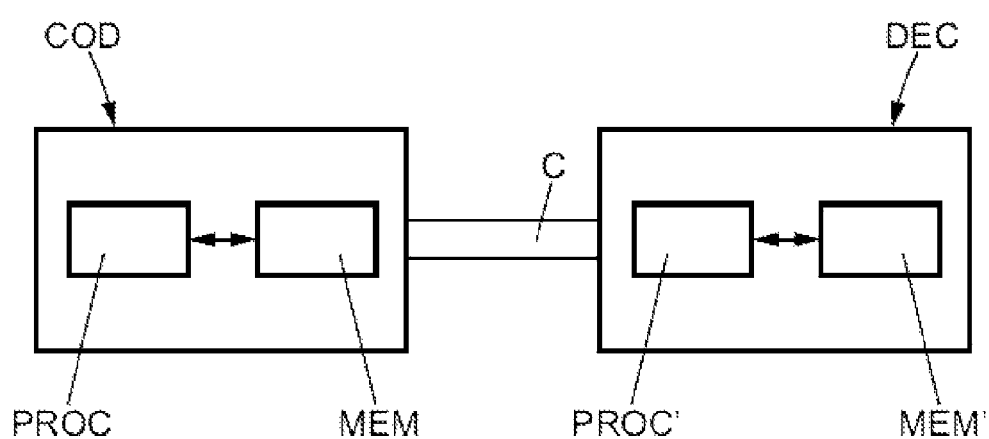
FIG. 11 shows a system of the coder/decoder type for implementation of the invention.

By considerably reducing the complexity of decoding of the low-band enhancement layer of the incoming streams and the re-encoding of the enhanced mixed signals, the invention allows the partial mixing to be extended to all the enhanced low bands by limiting the switching to the high-pass band layers. The continuity of the mixed low bands is thus ensured, which enhances the quality of the mixed streams with an increase in complexity that is reasonable. With reference to FIG. 10, for a teleconferencing bridge DIS between for example three terminals TER-A, TER-B, TER-C, a decision can be made in the example shown for the bridge DIS to enrich the G.711.1 signal from terminal TER-A for terminals TER-B and TER-C, and nonetheless mix the low band layers (core layer L0 and enhancement layer L1):

from terminals TER-B and TER-C for terminal TER-A (L0+L1[B+C]),
from terminals TER-A and TER-C for terminal TER-B (L0+L1[A+C]),
and from terminals TER-A and TER-B for terminal TER-C (L0+L1[A+B]), while also providing the enhancement layer stream L2[A] from terminal TER-A to terminals TER-B and TER-C.

Advantageously, the decoding of the three L1 layers and the re-encoding of the L1 enhancement layers in the three mixings with the lower layers L0 are performed with low complexity thanks to the implementation of the present invention.

Annexes 1 and 2 below present two embodiment examples of pseudo-codes corresponding to two respective situations:
where the multiplexing is performed in accordance with the state of the art according to the current Recommendation G.711.1 (first example embodiment in Annex 1),
where the multiplexing is performed on the fly following bit allocation of each sample (second example embodiment in Annex 2).

As part of Recommendation G.711.1, the coding of 40 samples with 80 bits has to be enhanced.

The number of values of exponents $N_e$ is then equal here to 8, the maximum number of enhancement bits $N_a$ being equal to 3.

In the first embodiment, the cumulative values of exponent counters are calculated using the recurrence formula and they are not stored.

In order to make greater savings in terms of random-access memory and complexity, in the second embodiment, the calculation steps for bit allocation and adaptive multiplexing are combined and the bit allocation table is not stored.

In the first embodiment, two tables of whole numbers are provided over 16 bits (Word 16), one of dimension 10 (=8+3−1) to store the exponent counters, the second of dimension 40 to store the bit allocation of the 40 samples.

The pseudo-code is given in Annex 1, where:
COM-1 corresponds to the comment: pointers on the tables,
COM-2 corresponds to the comment: pointer at address cnt[2], number of samples having 0 as exponents,
COM-3: exponent counter reset to zero,
COM-4: calculation of exponent counter table,
COM-5: memory access to read the exponent of sample n,
COM-6: pointing to address cnt0[iexp],
COM-7: increment by 1 of cnt0[iexp] and writing to memory,
COM-8: search for greatest exponent of the 40 samples: last non-zero element of cnt,
COM-9: search for iexp0: greatest exponent of the samples not receiving any enhancement bits,
COM-10: calculation of the cumulation of exponent counters cum by recurrence,
COM-11: addition of cnt0[iexp0] to cum: cum=cnt0[iexp0+2]+cnt0[iexp0+1]+cnt0[iexp0],
COM-12: decrement by 1 of iexp0,
COM-13: subtraction of cnt0[iexp0+3] from cum→cum=cnt0[iexp0+2]+cnt0[iexp0+1]
COM-14: calculation of nbEch1: number of samples the exponent of which is within the range [iexp0+1, iexp0+3] which will receive exp(n)−iexp0 enhancement bits,
COM-15: calculation of the number of samples the exponent of which are within the range [iexp0+1, iexp0+3]: cnt0[iexp0+3]+cnt0[iexp0+2]+cnt0[iexp0+1], by addition of cnt0[iexp0+3] to cum,
COM-16: calculation of nbEch1 by adding cum to the number of (negative) bits at the output of the conditional loop,
COM-17: bit allocation according to the difference between exponent iexpn of a sample and iexp0; if iexpn<=iexp0: nbBit=0; if iexp0<iexpn<=3 (samples with exponents within the range [iexp0+1, iexp0+3]); nbBit=iexpn−iexp0, for the first nbEch1 samples; nbBit=iexpn−iexp0−1, for the last samples; if iexpn>iexp0+3: nbBit=3,
COM-18: calculation of nbBit as the difference between the exponent of the sample and of iexp0,
COM-19: test if the exponent of the sample is within the range [iexp0+1,iexp0+3], by testing whether nbBit is less than or equal to 3,
COM-20: the exponent is within the range, decrement of the number of samples in that range which are allocated iexp-iexp0 bits,
COM-21: maximum number of bits allocated limited to 3,
COM-22: decrement of counter of samples which have received a bit allocation,
COM-23: bit allocation to last nbEch0 samples: among nbEch0 samples, the samples the exponent of which are within the range [iexp0+1, iexp0+3], receive iexpn-iexp0-1 bits.

Also, in order to take account of the complexity of non-regular addressing, an addition (add(0,0)) has been indicated.

It is noted that, thanks to the search for iexpMax, the greatest exponent of the 40 samples, the calculation of the cumulative values of the counters is on average less complex (since the cumulative values for the exponents greater than iexpMax are not calculated).

In a possible variant, a distinction is made for the special case of iexpMax=0 (with, in this case, the allocation of 2 bits to each of the 40 samples). In this variant, after having determined iexpMax, a test is performed to see whether it is strictly positive (IF (iexpMax>0)), in which case the steps are performed to determine iexp0, calculate NbEch1 and allocate bits by calculating the difference from iexp0 in two loops. Otherwise (iexpMax=0), these steps are omitted and 2 bits are allocated to each sample. In this variant where the case of iexpMax=0 is processed separately, the dimension of the table cnt (with reset of cnt0 to cnt+1) can be reduced by 1. On the other hand, distinguishing this special case increases the size of the program memory (requiring a supplementary set of program instructions for this case). This case is especially worthwhile when the bit allocation step is combined with that for multiplexing (according to the second embodiment described below), the multiplexing procedure being in this special case very simple and not very complex.

It can thus be seen that the invention offers several possible variants depending on the target applications.

In the second embodiment presented in Annex 2, the calculation steps for bit allocation and adaptive multiplexing are combined and the bit allocation table need not be stored. The first steps (calculation of the exponent counter table, search for the greatest exponent of the 40 samples, search for the greatest exponent of the samples not receiving any enhancement bits, calculation of the number of samples having an exponent within the range [iexp0+1, iexp0+3] which will receive (exp(n)−iexp0) enhancement bits) are the same as in the first embodiment above.

The general case (iexpMax>0) is first given.

After the preliminary steps, the adaptive multiplexing is performed in the two bit allocation calculation loops. Before the conditional loop (WHILE(nbEch1>0)), the same resets as those described in the prior art are performed.

The pseudo-code for Annex 2 calls the following comments:

COM-50: extracted from the mux_cod routine, this routine performs the adaptive multiplexing and contains the same set of instructions as in the state of the art;

COM-51: but unlike the state of the art, it is possible for the routine not to be called if no bit is allocated; in a variant to avoid a test (ELSE) and reduce the number of instructions, it is possible, as in the state of the art, to call the routine for all the samples, including those having 0 enhancement bit allocated.

The invention thus makes it possible to significantly reduce the size of the random-access memory needed and the number of calculations. Furthermore, thanks to this reduction in complexity and memory, it is possible to enhance the quality of the partial mixing in particular in conferencing bridges by advantageously replacing the partial mixing limited to the core layers with partial mixing of the complete low band signals (comprising the core and enhancement hierarchical layers).

ANNEX 1

```
Word16 cnt[10], b[40];
Word16 *ptr_cnt, *ptr_cnt2, *ptr_exp, *ptr_b; /* COM-1 */
Word16 iexp, n, iexpMax, iexp0, cum, nbBit;
Word16 *ptr_cnt0 = cnt+2; /* COM-2 */
/* COM-3 */
ptr_cnt = cnt;
FOR(iexp=0; iexp<10; iexp++)
{
   *ptr_cnt++ = 0; move16( );
}
```

-continued

ANNEX 1

```
/* COM-4 */
ptr_exp =exp;
FOR(n=0; n<40; n++)
{
   iexp =*ptr_exp++; move16( );/* COM-5 */
   ptr_cnt = cnt0 + iexp; add(0,0); /* COM-6 */
   *ptr_cnt = add(*ptr_cnt, 1); move16( );/* COM-7 */
}
/* COM-8 */
iexpMax = 7; move16( );
ptr_cnt = cnt0 + iexpMax; add (0,0);
WHILE(*ptr_cnt-- == 0) iexpMax = sub(iexpMax,1);
/* COM-9 */
/* COM-10 */
ptr_cnt++; /* ptr_cnt =&cnt0[iexpMax] */
ptr_cnt2 = ptr_cnt;
nbBit= sub(80, *ptr_cnt--); /* nbBit = 80 − cnt0[iexpMax] */
cum = add(*ptr_cnt2, *ptr_cnt--); /* cum = cnt0[iexpMax] + cnt0[iexpMax−1] */
nbBit= sub(nbBit, cum);
/* nbBit = 80 − cnt0[iexpMax] − (cnt0[iexpMax] + cnt0[iexpMax−1]) */
iexp0 = sub(iexpMax, 2);
WHILE(nbBit> 0) {
/* COM-11 */
   cum = add(cum, *ptr_cnt--);
   nbBit= sub(nbBit, cum);
/* COM-12 */
   iexp0 = sub(iexp0, 1);
/* COM-13 */
   cum = sub(cum, *ptr_cnt2--);
}
/* COM-14 */
/* COM-15 */
cum = add(cum, *(++ptr_cnt2));
/* COM-16 */
nbEch1= add(nbBit, cum);
/* COM-17 */
ptr_exp =exp;
ptr_b = b;
WHILE(nbEch1 > 0) {
/* COM-18 */
   nbBit = sub(*ptr_exp++, iexp0);
   nbBit = s_max (nbBit,0); /* if exp <iexp0, 0 bit */
   IF(nbBit> 0) {
/* COM-19 */
      if(sub(nbBit, 3) <= 0) {
/* COM-20 */
         nbEch1 = sub(nbEch1, 1);
      }
/* COM-21 */
      nbBit = s_min(nbBit, 3);
   }
   *ptr_b++ = nbBit; move16( );
   nbEch0 = sub(nbEch0 ,1); /* COM-22 */
}
/* COM-23 */
iexp0= add(iexp0, 1);
FOR(i=0;i<nbEch0; i++) {
   nbBit = sub(*ptr_exp++, iexp0);
   nbBit = s_max (nbBit,0);
   nbBit = s_min(nbBit, 3);
   *ptr_b++ = nbBit; move16( );
}
```

ANNEX 2

```
WHILE(nbEch1 > 0)
{
   nbBit = sub(*ptr_exp++, iexp0);
   IF(nbBit> 0)
   {
```

ANNEX 2
-continued

```
    nbShr = sub(3, nbBit);
    if(nbShr >= 0) nbEch1 = sub(nbEch1, 1);
    nbShr = s_max(nbShr , 0);
    *ptr = shr(*ptr, nbShr); move16( );
    nbBit = sub(3, nbShr);
    mux_cod(&tmp1, nbBit, *ptr, &bit_pos, &pcode1);
  }
  ELSE
  {
     *ptr = shr(*ptr, 3); move16( );
  }
  ptr++;
  nbEch0 = sub(nbEch0 ,1);
}
iexp0= add(iexp0, 1);
FOR(i=0; i<nbEch0; i++)
{
  nbBit = sub(*ptr_exp++, iexp0);
  IF(nbBit> 0)
  {
    nbBit = s_min(nbBit, 3);
    nbShr =sub(3, nbBit);
    *ptr = shr(*ptr, nbShr); move16( );
    mux_cod(&tmp1, nbBit, *ptr, &bit_pos, &pcode1);
  }
  ELSE
  {
     *ptr = shr(*ptr, 3); move16( );
  }
  ptr++;
}
/* COM 50 */
  octet = shl(octet, nbBit);
  octet = s_or(octet, val);
  bit_pos= add(bit_pos, nbBit);
  IF (sub(bit_pos, 8) >= 0)
  {
    bit_pos= sub(bit_pos, 8);
    temp = shr(octet, bit_pos);
    octet = sub(octet, shl(temp, bit_pos));
    **ptr_bst = (unsigned char)temp; move16( );
    (*ptr_bst)++;
  }
/* COM-51 */
  WHILE(nbEch1 > 0)
  {
    nbBit = sub(*ptr_exp++, iexp0);
    nbBit = s_max (nbBit,0);
    IF(nbBit> 0)
    {
      if(sub(nbBit, 3) <= 0)nbEch1 = sub(nbEch1, 1);
      nbBit = s_min(nbBit, 3);
    }
    nbShr = sub(3, nbBit);
    *ptr = shr(*ptr, nbShr); move16( );
    mux_cod(&tmp1, nbBit, *ptr, &bit_pos, &pcode1);
    ptr++;
    nbEch0 = sub(nbEch0 ,1);
  }
  iexp0= add(iexp0, 1);
  FOR(i=0; i<nbEch0; i++)
  {
    nbBit = sub(*ptr_exp++, iexp0);
    nbBit = s_max (nbBit,0);
    nbBit = s_min(nbBit, 3);
    nbShr = sub(3, nbBit);
    *ptr = shr(*ptr, nbShr); move16( );
    mux_cod(&tmp1, nbBit, *ptr, &bit_pos, &pcode1);
  }
```

The invention claimed is:

1. A method for bit allocation in a hierarchical coding/decoding comprising coding/decoding of a digital signal enhancement layer comprising a succession of L samples, each sample comprising a mantissa and an exponent, the method comprising the allocation of a predetermined number $N_b$ of enhancement bits to at least some of the L samples having the greatest exponent values, wherein the method is implemented by a processor of a coder/decoder and comprises the following steps:

a) enumerating the exponents of the L samples, each having a given value, b) calculating at least one cumulative value of enumerations of exponents by decreasing exponent values until the predetermined number $N_b$ is approximated from above in order to c) determine a threshold value for the greatest exponent of a sample for which no further enhancement bit is available, allocating the $N_b$ enhancement bits, according to selected rules, to samples the exponent of which is greater than said threshold value, and coding/decoding a digital signal enhancement layer of a digital audio signal comprising the L samples.

2. The method according to claim 1, wherein, according to said selected rules, provision is made for a maximum number $N_a$ of bits to be allocated for a sample and the following are reserved:

$N_a$ bits for allocation to each sample the exponent of which is greater than a sum of the threshold value and the maximum number $N_a$, no bits for samples the exponent of which is less than or equal to said threshold value, and a number of additional bits among the number $N_b$ of bits for allocation to samples the exponent of which is comprised between the threshold value plus one and the sum of the threshold value and the maximum number $N_a$.

3. The method according to claim 2, wherein the following are allocated to each sample the exponent of which is comprised between the threshold value plus one and the sum of the threshold value and the maximum number $N_a$:

the difference between the exponent of a sample and the threshold value, or this difference less one, depending on a selected criterion.

4. The method according to claim 3, wherein the selected criterion corresponds to a positional order of the sample in the succession of samples.

5. The method according to claim 2, wherein the method comprises:

b1) a determination of a greatest exponent value among the L samples;

b2) a cumulation of the numbers of exponents from the greatest exponent value to said greatest value decremented $N_a$ times; and b3) a conditional loop such that:

if the cumulation remains less than the total number of bits $N_b$ to be allocated to the L samples, this cumulation is added to a new cumulation calculated by implementation of operation b2) with decrementation of the greatest exponent value by one, the result of such decrementation being taken for the implementation of operation b2) as the greatest exponent value, with loop iteration of operation b2) as long as said cumulation resulting from operation b2) remains less than the number $N_b$, otherwise, a number of additional bits remaining at an immediately preceding iteration of operation b2) is calculated in order to determine a number of samples the exponent of which is comprised between the threshold value plus one and the sum of the threshold value and the maximum number $N_a$.

6. The method according to claim 2, wherein the bit allocation to the L samples is performed by the execution of two loops:
- a first loop until bit allocation to samples with an exponent between the threshold value plus one and the sum of the threshold value and the maximum number $N_a$ has been performed, a number of iterations of the first loop being counted,
- then, a second loop to perform bit allocation of the last remaining samples, iterated a number of times which is a function of said number of iterations of the first loop.

7. The method according to claim 1, wherein a table of exponent counters is established in step a) and an address pointer in the table is decremented in a conditional loop for the implementation of step b).

8. The method according to claim 6, wherein determination of the greatest exponent value among the L samples is performed by reading said table.

9. The method according to claim 1, wherein the method comprises, in the coding, the composition of a bitstream of an enhancement signal resulting from the coding of the enhancement layer,
- said composition is carried out on the fly after bit allocation of each sample.

10. The method according to claim 1, wherein the quantization step is of the Pulse Code Modulation type according to a logarithmic amplitude compression coding law of type A or type µ in accordance with ITU-T Recommendation G.711.1.

11. Application of the method according to claim 1 to signal processing by at least partial decoding, mixing and at least partial re-encoding of incoming bitstreams in an audio bridge architecture for teleconferencing.

12. A non-transitory computer readable storage medium, with a program stored thereon, where the program comprises instructions for the implementation of the method according to claim 1, when they are executed by a processor.

13. A device for the coding of an enhancement layer in a hierarchical coding of a digital audio signal comprising a succession of samples, wherein the device comprises computerized means for the implementation of the method according to claim 1.

14. A device for the decoding of an enhancement layer in a hierarchical decoding of a digital audio signal comprising a succession of samples, wherein the device comprises computerized means for the implementation of the method according to claim 1.

* * * * *